United States Patent
Carlisle

(10) Patent No.: US 9,068,260 B2
(45) Date of Patent: Jun. 30, 2015

(54) KNIFE FOR WOOD PROCESSING AND METHODS FOR PLATING AND SURFACE TREATING A KNIFE FOR WOOD PROCESSING

(71) Applicant: Andritz Iggesund Tools Inc., Glens Falls, NY (US)

(72) Inventor: Jennings Drake Carlisle, Clearwater, FL (US)

(73) Assignee: ANDRITZ IGGESUND TOOLS INC., Oldsmar, FL (US)

( * ) Notice: Subject to any disclaimer, the term of this patent is extended or adjusted under 35 U.S.C. 154(b) by 35 days.

(21) Appl. No.: 13/795,948

(22) Filed: Mar. 12, 2013

(65) Prior Publication Data

US 2013/0239769 A1    Sep. 19, 2013

Related U.S. Application Data

(60) Provisional application No. 61/610,883, filed on Mar. 14, 2012, provisional application No. 61/610,894, filed on Mar. 14, 2012.

(51) Int. Cl.
*B26D 1/00*       (2006.01)
*C23C 16/38*      (2006.01)
(Continued)

(52) U.S. Cl.
CPC . *C23C 16/38* (2013.01); *C23C 8/70* (2013.01); *C23C 8/68* (2013.01); *C23C 10/28* (2013.01);
(Continued)

(58) Field of Classification Search
CPC ...... B26D 1/0006; B23B 27/14; B23B 51/00; B23C 15/16; C23C 14/0641; B32B 9/00
USPC ............ 83/651; 428/216, 698, 335, 336, 213, 428/323, 697, 699, 469, 472, 704, 660, 428/661; 427/337, 282, 299; 30/346.54, 30/346.53, 346, 350; 76/104.1
See application file for complete search history.

(56) References Cited

U.S. PATENT DOCUMENTS 2,121,589 A    6/1938    Espe
2,268,691 A    1/1942    Brooke
(Continued)

FOREIGN PATENT DOCUMENTS

DE    19822935 C2    11/1999
EP    0387536 A1     9/1993
(Continued)

OTHER PUBLICATIONS

Cabeo et al., "Plasma-assisted boriding of industrial components in a pulsed d.c. glow discharge," Surface and Coatings Technology, Sep. 1999, pp. 229-233, vols. 116-119, Elsevier Science S.A.
(Continued)

*Primary Examiner* — Ghassem Alie
(74) *Attorney, Agent, or Firm* — Tutunjian & Bitetto, P.C.

(57) ABSTRACT

A knife structure including a knife body having a cutting surface, a relief surface and a knife clamp surface. The cutting surface and the relief surface intersect at an apex region of the knife body. The knife clamp surface intersects with an end of the relief surface opposite an end of the relief surface that intersects with the cutting surface at the apex region. In one embodiment, the apex region is comprised of an alloy of a base material for the knife body and a boron containing compound. The thermally conductive plating is present on at least the knife clamp surface, the cutting surface and the release surface of the knife body. The thermally conductive plating is not present on the apex region.

14 Claims, 8 Drawing Sheets

(51) Int. Cl.

| | | |
|---|---|---|
| *C23C 8/70* | (2006.01) | |
| *C23C 8/68* | (2006.01) | |
| *C23C 10/28* | (2006.01) | |
| *C23C 8/60* | (2006.01) | |
| *C23C 16/448* | (2006.01) | |
| *B27L 11/02* | (2006.01) | |
| *C23C 8/10* | (2006.01) | |
| *C23C 8/36* | (2006.01) | |
| *C23C 28/00* | (2006.01) | |

(52) U.S. Cl.
CPC ............... *C23C 8/60* (2013.01); *C23C 16/448* (2013.01); *B27L 11/02* (2013.01); *B26D 1/0006* (2013.01); *B26D 2001/002* (2013.01); *C23C 8/10* (2013.01); *C23C 8/36* (2013.01); *C23C 28/322* (2013.01); *C23C 28/345* (2013.01)

(56) References Cited

U.S. PATENT DOCUMENTS

| | | | |
|---|---|---|---|
| 2,910,382 A | 10/1959 | Vulliez | |
| 3,029,162 A | 4/1962 | Samuel et al. | |
| 3,470,030 A | 9/1969 | Karlsson et al. | |
| 3,477,827 A | 11/1969 | Mott | |
| 3,673,005 A | 6/1972 | Kunst | |
| 3,774,703 A * | 11/1973 | Sanderson | 428/600 |
| 3,809,583 A | 5/1974 | Kryzminiski et al. | |
| 3,874,900 A * | 4/1975 | Post et al. | 428/472 |
| 3,985,917 A | 10/1976 | Krukonis | |
| 4,011,107 A | 3/1977 | Hayes | |
| 4,106,382 A | 8/1978 | Salje et al. | |
| 4,188,242 A | 2/1980 | Scales | |
| 4,192,983 A | 3/1980 | Paoletti | |
| 4,239,819 A | 12/1980 | Holz | |
| 4,348,980 A | 9/1982 | Thevenot et al. | |
| 4,404,045 A | 9/1983 | Thevenot | |
| 4,536,224 A | 8/1985 | Beyer et al. | |
| 4,605,343 A | 8/1986 | Hibbs, Jr. et al. | |
| 4,629,661 A | 12/1986 | Hillert et al. | |
| 4,637,837 A | 1/1987 | von Matuschka et al. | |
| 4,890,574 A | 1/1990 | Sarin | |
| 5,068,871 A | 11/1991 | Uchida et al. | |
| 5,279,737 A | 1/1994 | Sekhar et al. | |
| 5,296,416 A | 3/1994 | Park et al. | |
| 5,308,399 A | 5/1994 | Pillhoefer et al. | |
| 5,437,832 A | 8/1995 | Imamura et al. | |
| 5,439,525 A | 8/1995 | Peichl et al. | |
| 5,441,762 A | 8/1995 | Gray et al. | |
| 5,455,068 A | 10/1995 | Aves | |
| 5,558,760 A | 9/1996 | Sekhar | |
| 5,766,458 A | 6/1998 | Sekhar et al. | |
| 5,861,630 A | 1/1999 | Becker | |
| 5,882,730 A | 3/1999 | Kimura | |
| 5,963,709 A | 10/1999 | Staples et al. | |
| 6,113,802 A | 9/2000 | Penumella | |
| 6,113,982 A | 9/2000 | Claar et al. | |
| 6,245,162 B1 | 6/2001 | Baudis et al. | |
| 6,258,172 B1 | 7/2001 | Foster et al. | |
| 6,306,225 B1 | 10/2001 | Hunger | |
| 6,330,750 B1 * | 12/2001 | Meckel | 30/350 |
| 6,413,585 B1 | 7/2002 | Madec | |
| 6,684,513 B1 * | 2/2004 | Clipstone et al. | 30/346.54 |
| 6,911,234 B2 | 6/2005 | Warnes et al. | |
| 7,767,274 B2 | 8/2010 | Skaff | |
| 7,901,796 B2 * | 3/2011 | Fukui et al. | 428/697 |
| 7,935,426 B2 | 5/2011 | Vetter | |
| 7,955,569 B2 | 6/2011 | Patrovsky | |
| 8,007,922 B2 | 8/2011 | Mirchandani et al. | |
| 2003/0209534 A1 | 11/2003 | Ferguson | |
| 2005/0208218 A1 | 9/2005 | Becker et al. | |
| 2008/0191153 A1 | 8/2008 | Marganski et al. | |
| 2008/0233428 A1 | 9/2008 | Skaff | |
| 2009/0226688 A1 | 9/2009 | Fang | |
| 2009/0293993 A1 | 12/2009 | Zlatev | |
| 2009/0320299 A1 * | 12/2009 | Kuhn et al. | 30/169 |
| 2010/0243335 A1 | 9/2010 | Dourfaye et al. | |
| 2010/0255198 A1 | 10/2010 | Cleary et al. | |
| 2011/0293825 A1 | 12/2011 | Atwal | |
| 2012/0034378 A1 | 2/2012 | Woelk et al. | |
| 2012/0046735 A1 | 2/2012 | Sill et al. | |
| 2012/0046757 A1 | 2/2012 | Breitenkamp et al. | |
| 2012/0317822 A1 * | 12/2012 | Ochiai et al. | 30/350 |

FOREIGN PATENT DOCUMENTS

| | | | |
|---|---|---|---|
| GB | 663377 | 12/1951 | |
| JP | 54066383 A | 5/1979 | |
| JP | 5285707 A | 11/1993 | |
| JP | 09314406 A * | 12/1997 | B23B 27/20 |
| JP | 10068069 A | 3/1998 | |
| JP | 10148102 A | 6/1998 | |
| RU | 2008139354 A | 4/2010 | |
| WO | 9718912 A1 | 5/1997 | |
| WO | 2008066438 A1 | 6/2008 | |
| WO | 2008100155 A1 | 8/2008 | |

OTHER PUBLICATIONS

Kaestner et al., "Plasma-assisted boriding of pure titanium and TiA16V4," Surface and Coatings Technology, Jul. 2001, pp. 248-252, vols. 142-144, Elsevier Science B.V.

Pertek, "Gas Boriding Conditions for the Iron Borides Layers Formation," Materials Science Forums, Jun. 1994, pp. 323-328, vols. 163-165, Trans Tech Publications, Switzerland.

Formanek, "The Diffusion Boronizing Process of Reactive Atmospheres Containing Boron Fluorides," Materials Science Forum, Jun. 1994, pp. 317-322, vols. 163-165, Trans Tech Publications, Switzerland.

Suwattananont, "Surface Treatment of Ferrous Alloys With Boron," Aug. 2004, pp. 1-54, New Jersey's Science & Technology University.

Gupta et al., "Effect of stress-induced phase transformation on the properties of polycrystalline zirconia containing metastable tetragonal phase," Journal of Materials Science, Jul. 1978, pp. 1464-1470, vol. 13, Chapman and Hall Ltd., Great Britain.

Xu et al., "Effect of Micro-addition Rare Earth and Chrome on Friction and wear Behavior of boronized layer," Nov. 2005, Department of Materials Science and Engineering, Shandong Institute of Architecture and Engineering, Jian, China; Institute of Materials Science and Engineering, Shandong.

Capan et al., "Erosion-corrosion resistance of boronised steels," Materials Science Forums, Jun. 1994, pp. 329-334, vols. 163-165, Trans Tech Publications, Switzerland.

Palombarini et al., "Role of oxygen in iron boriding using boron carbide," Journal of Material Science Letters, May 1993, pp. 741-742, vol. 12, Chapman & Hall.

Su Z et al., "Effect of rare earth element on boronization kinetics," The Journal Jiliin kinetics, Engineering and Technology Edition, Jan. 2010, pp. 82-86 vol. 40, No. 1.

International Search Report and Written Opinion issued in PCT/US2013/031378 dated Jun. 5, 2013.

International Search Report and Written Opinion issued in PCT/US2013/031384 dated Jun. 5, 2013.

R.M. Mohanty et al., "Multiphase Formation of Boron Carbide in B2O3—Mg—C Based Micropyretic Process," Journal of Alloys and Compounds 441 (2007) 85-92.

"Process Comparisons," Chapter 7, Surface Engineering for Corrosion and Wear Resistance, J.R. Davis, Ed., p. 183-193. © 2001 ASM International.

* cited by examiner

KNIFE FOR WOOD PROCESSING AND METHODS FOR PLATING AND SURFACE TREATING A KNIFE FOR WOOD PROCESSING

CROSS REFERENCE TO RELATED APPLICATIONS

This application claims the benefit of U.S. Provisional Application No. 61/610,883 filed Mar. 14, 2012, and U.S. Provisional Application No. 61/610,894 filed Mar. 14, 2012, which are both incorporated herein in their entirety by reference. The present invention is related to the application titled "PROCESS AND APPARATUS TO TREAT METAL SURFACES" having U.S. patent application Ser. No. 13/795,870, which is a commonly-owned, and co-pending United States Patent Application that has been filed on the same date herewith, the entire contents and disclosure of which is expressly incorporated by reference.

BACKGROUND

The present disclosure relates to knives for wood processing and wood working, such as wood chipping knives and wood pulping knives. The present disclose further relates to treatments of metal used in wood processing and woodworking.

SUMMARY

In one aspect of the present disclosure, a knife structure is provided that includes a knife body having a cutting surface, a relief surface and a knife clamp surface. The cutting surface and the relief surface intersect at an apex region of the knife body. In one embodiment, the apex region is comprised of an alloy of a base material for the knife body and a boron containing compound. In some embodiments, the thermally conductive plating is present on at least the knife clamp surface, the cutting surface and the release surface of the knife body. The thermally conductive plating is not present on the apex region.

In one aspect of the present disclosure, a knife structure is provided that includes a knife body having a cutting surface, a relief surface and a knife clamp surface. The cutting surface and the relief surface intersect at an apex region of the knife body. In one embodiment, the apex region is comprised of an alloy of a base material for the knife body and a boron containing compound. In some embodiments, the thermally conductive plating is present on at least the knife clamp surface, the cutting surface and the release surface of the knife body, as well as the apex region.

In another aspect of the present disclosure, a method of forming a knife structure is provided. The method may include providing a knife body having a cutting surface, a relief surface and a knife clamp surface. The cutting surface and the relief surface intersect at an apex region. In one embodiment, a thermally conductive plating is formed on the knife structure including the cutting surface, the relief surface and the clamp surface. The method may further include boriding the apex region of the knife structure. The thermally conductive plating transmits heat that is produced at the apex region of the knife body to a heat sink that is in contact with the knife clamp surface of the knife body.

In another embodiment, a method of forming a knife structure is provided that includes providing a knife body having a cutting surface, a relief surface and a knife clamp surface. The cutting surface and the relief surface intersect at an apex region. The apex region of the knife structure may then be borided. Following boriding, a thermally conductive plating is formed on the knife structure including at least the cutting surface, the relief surface and the clamp surface. The thermally conductive plating transmits heat that is produced at the apex region of the knife body to a heat sink that is in contact with the knife clamp surface of the knife body.

BRIEF DESCRIPTION OF SEVERAL VIEWS OF THE DRAWINGS

The following detailed description, given by way of example and not intended to limit the disclosed structures and methods solely thereto, will best be appreciated in conjunction with the accompanying drawings, wherein like reference numerals denote like elements and parts, in which.

DETAILED DESCRIPTION OF THE INVENTION

Figure 1:
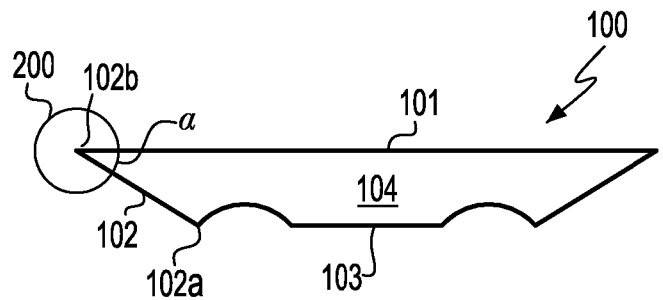
FIG. 1 is top down perspective view of a knife structure for wood processing and wood working applications, in accordance with one embodiment of the present disclosure.

Detailed embodiments of the claimed methods and structures are disclosed herein; however, it is to be understood that the disclosed embodiments are merely illustrative and may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the embodiments of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "vertical", "horizontal", "top", "bottom", and derivatives thereof shall relate to the embodiments of the disclosure, as it is oriented in the drawing figures.

The methods and structures disclosed herein may provide knives for wood processing and wood working, such as wood chipping knives and wood pulping knives that have an improved cutting life. A knife works when the force, i.e., contact area pressure, of a knife is applied to the target at the tensile points, i.e., shear strength, of a target, i.e., material being cut. Typically, cutting life can be improved by altering variables of the knife, such as the cutting angle, and difference between hardness and toughness of the knife in comparison the material being cut. Failure of a knife can be caused by wear from abrasion or erosion; and wear from corrosion. Failure of a knife may also result from spalling or chipping of the knife edge due to the build-up of residual stresses, as may be referred to as "fatigue". Impact forces exceeding the plastic deformation limits of the edge material of the knife is another means by which a knife may fail. Failure of a knife can also be the result of a change in base metal's hardness due to annealing; or a change in the base metal's hardness due to increases in heat at the cutting tip that are generated from friction.

FIG. 1 depicts one embodiment of a knife structure 100 including a knife body having a cutting surface 101, a relief surface 102 and a knife clamp surface 103. The cutting surface 101 and the relief surface 102 intersect at an apex region 200 of the knife body. The knife clamp surface 103 intersects with a first end 102a of the relief surface 102 opposite a second end 102b of the relief surface 102 that intersects with the cutting surface 101 at the apex region 200. The angle α at the intersect of the cutting surface 101 and the relief surface 102 at the apex region 200 included angle may range from 10° to 60°. In another embodiment, the angle α at the intersect of the cutting surface 101 and the relief surface 102 may range from 25° to 48°. In yet another embodiment, the angle α at the intersect of the cutting surface 101 and the relief surface 102 may be 30° to 42°. In one embodiment, the apex region 200 of the knife structure 100 is comprised of an alloy of a base material for the knife body and at least one boron containing compound. In some embodiments, the apex region 200 extends from the intersecting point of the cutting surface 101 and the relief surface 102 (at the end of the relief surface identified by reference number 102b) may a dimension ranging from 1 mm to 5 mm. In another embodiment, the apex region 200 extends from the intersecting point of the cutting surface 101 and the relief surface 102 (at the end of the relief surface identified by reference number 102b) may a dimension ranging from 1 mm to 3 mm.

In some embodiments, a thermally conductive plating 104 is present on the portions of the knife body that include at least the knife clamp surface 103, the cutting surface 101 and the release surface 102. The thermally conductive plating 104 is not present on the apex region 200. In some embodiments, the thermally conductive plating 104 covers the entirety of the knife structure 100, with the exception of the apex region 200. The thermally conductive plating 104 does not cover the apex region 200. In other embodiments of the present disclosure, the thermally conductive plating 104 may also be present over the apex region 200. In some embodiments, in which the thermally conductive plating 104 is formed over the apex region 200, during use of the knife structure 100 in a cutting application, such as wood chipping or pulping operation, the thermally conductive plating 104 may be worn from the apex region 200 of the knife structure 100.

In some embodiments, the thermally conductive plating 104 is one feature that contributes to an improved heat management of the knife structures 100 that is provided by the present disclosure. The apex region 200 of the knife structure 100 can reach temperatures of approximately 1000° F. during operation. When operating over a long duration, such as a time period ranging from 8 hours to 12 hours, this build up of heat can result in the reduction of metal hardness. In one example, when hardness of the apex region 200 of the knife structure 100 drops from a Rockwell hardness of 58 Rc to 50 Rc, the tensile strength and compressive strength of the metal may fall by 25%. In some examples, it has been determined that in an 8 hour shift of wood chipping, the hardness of the apex region 200 of a knife structure 100 may fall from a Rockwell hardness of 58 Rc to 53 Rc. The thermally conductive plating 104 provides a means of thermal management for the knife structure 100, because the thermally conductive plating 104 acts as a heat sink to remove the heat from the apex region 200 of the knife structure 100. The thermal conductive plating 104 may be any material having a greater thermal conductivity than the base material of the knife body of the knife structure 100. For example, the thermally conductive plating 104 may be composed of copper (Cu), which can have a thermal conductivity that is on the order of 10× greater than the thermal conductivity of steel, which is a common composition for the base composition of the knife body for the knife structure 100.

Typically, the knife body is composed of an iron containing metal, such as steel. Depending upon carbon content, steel typically has a thermal conductivity ranging from 15 Btu/(hr° F. ft) to 35 Btu/(hr° F. ft) at room temperature, e.g., 68° F. For example, carbon steel having a maximum carbon content of 0.5% may have a thermal conductivity ranging from 21 Btu/(hr° F. ft) to 31 Btu/(hr° F. ft) at room temperature, e.g., 68° F. For example, carbon steel having a maximum carbon content of 1.5% may have a thermal conductivity ranging from 17 Btu/(hr° F. ft) to 19 Btu/(hr° F. ft) at room temperature, e.g., 68° F.

The base material of the knife body may be a steel composition comprising a carbon content of 1 wt. % or less. In one example, the base material of the knife body may be a low carbon steel composition comprising a carbon content of 0.1 wt. %-0.39 wt. %. In another example, the base material of the knife body may be a medium carbon steel comprising a carbon content ranging from 0.4 wt. %-0.7 wt. %. In yet another example, the base material for the knife body may be a high carbon steel having carbon (C) present in greater than 0.7 wt % and less than 0.99 wt. %. In yet a further example, the base material for the knife body may be composed of a steel having a carbon content ranging from 0.47 wt. % to 0.52 wt. %, which is suitable for knife blades used in wood chipping and pulping operations. Examples of low carbon steels that are suitable for boriding in accordance with the methods and structures disclosed herein include, but are not limited to, American Iron and Steel Institute (AISI) 1005-1026, AISI 1108-1119, AISI 1211-1215, AISI 1513-1527, and combinations thereof. The base material of the knife body can include impact boron steels with a boron content of up to 0.003%. The base material of the knife body may be substantially free of boron. The term "substantially free of boron" means that the base material of the knife body is less than 0.005% boron. It is noted that the above compositions are provided for illustrative purposes only, and that other metals that are not described above are equally suitable for the base material of the knife body.

The thermally conductive plating 104 may be any material having a greater thermal conductivity than the base material of the knife body for the knife structure 100. As used herein, the term "thermally conductive" as used to describe the thermally conductive plating 104 denotes a material layer having a thermal conductivity that is equal to 40 Btu/(hr° F. ft) or greater at room temperature, e.g., 68° F. In one embodiment, the thermally conductive plating 104 has a thermal conductivity ranging from 45 Btu/(hr° F. ft) to 250 Btu/(hr° F. ft) at room temperature, e.g., 68° F. In another embodiment, the thermally conductive plating 104 has a thermal conductivity ranging from 60 Btu/(hr° F. ft) to 230 Btu/(hr° F. ft) at room temperature, e.g., 68° F. In yet another embodiment, the thermally conductive plating 104 has a thermal conductivity ranging from 100 Btu/(hr° F. ft) to 200 Btu/(hr° F. ft) at room temperature, e.g., 68° F. In some embodiments, the thermally conductive plating 104 may be a composition selected from the group consisting of copper (Cu), silver (Au), gold (Ag), chromium (Cr), molybdenum (Mo), tungsten (W), aluminum (Al), and alloys thereof. Stated another way, the thermally conductive plating 104 may be composed of any element from Group 6 or Group 11 of the Periodic Table of Elements. In some other embodiments, the thermally conductive plating is a ceramic composition that is selected from the group consisting of aluminum nitride, boron nitride, silicon carbide and a combination thereof. The thickness of the thermally conductive plating 104 may range from 5 microns to 125 microns. In another embodiment, the thickness of the thermally conductive plating 104 may range from 20 microns to 100 microns. In one example, the thickness of the thermally conductive plating 104 is on the order of 50 microns.

Figure 2:
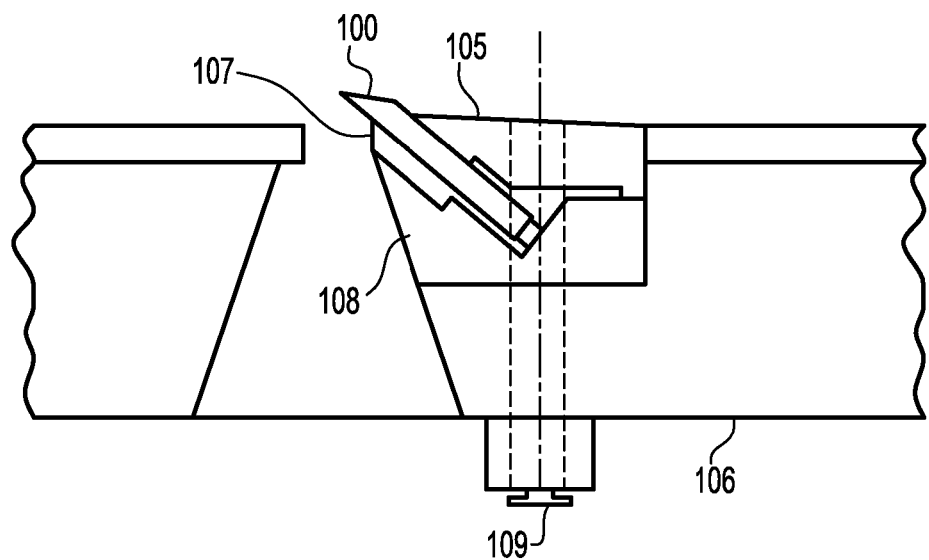
FIG. 2 is a side cross-sectional view of the knife structure depicted in FIG. 1 clamped to the disc of a wood chipper, in accordance with one embodiment of the present disclosure.

Referring to FIGS. 1 and 2, the thermally conductive plating 104 transfers heat away from the apex region 200 of the knife structure 100 into a larger knife clamp 105 and disc 106 of a wood processing apparatus, such as a wood chipper. The knife clamp 105 and disk 106 of the wood processing apparatus may function as a heat sink. The knife clamp 105 and disk 106 of the wood processing apparatus are typically composed of steel. By functioning as a heat sink, heat is transferred from the apex region 200 of the knife structure 100 to the knife clamp 105 and disk 106 of the wood processing apparatus, therefore reducing the temperature of the apex region 200 of the knife structure 100. It is noted that the wood chipping apparatus depicted in FIG. 2 further includes clamp studs 109, a knife structure carrier 108, and a counter knife 107. These features may also function as a heat sink. Heat is conducted in solids by conduction. Conduction occurs when two objects with different temperatures come into contact with one another. At the point where the two objects meet, the faster moving molecules of the warmer object crash into the slower moving molecules of the cooler object. When this happens, the faster moving molecules from the warmer object give energy to the slower moving molecules, which in turn heats the cooler object. In some embodiments, this is the mechanism by which heat is transferred from the apex region 200 of the knife structure to the knife clamp 105. In one example, in which the knife structure 100 is plated with a thermally conductive plating 104 of copper (with no plating on the apex region 200), the amount of area transferring heat at the rate of copper may equal approximately 4% of the density of the knife, possibly resulting in an improvied efficiency, i.e., service life, of up to 40%. For example, for a knife treated in accordance with the present disclosure, the life of the knife may be extended from 8 hours to greater than 11 hours, e.g., 11.2 hours, before experiancing a drop in hardness, such as a drop in hardness from a Rockwell hardness of 58 Rc to 53 Rc.

The portion of the knife structure 100 that is not plated with the thermally conductive plating 104 is the apex region 200 of the knife structure 100, which is treated with thermochemical diffusion treatments for increased mechanical properties, such as increased hardness. In some embodiments, the thermochemical diffusion treatments toughen the apex region 200 of the knife structure 100. For the case of metastable austenitic materials that undergo a stress-induced martensitic transformation, it may be suggested that the phase transformation in front of a crack is equivalent to a non-elastic deformation, and as such, may be capable of absorbing energy that would have otherwise been available for crack extension. Another reason for energy absorption would be given for the case of stress-induced phase transformation during crack extension in brittle materials. Volume changes occur during phase transformation and stress-induced transformation may be accompanied by the formation of a small crack within or in the vicinity of the transformed particle. The formation of many small cracks in front of a larger crack may greatly increase the amount of surface area formed per unit extension of the larger crack and thus, in effect, greatly increase the energy absorbed during crack extension.

Although not depicted in the supplied figures, embodiments have been contemplated, in which the entire surface of the knife structure 100 including the apex region 200 are covered with a plating of the thermally conductive plating 104. In these embodiments, the apex region 200 may be treated with the thermochemical diffusion treatment prior to plating with the thermally conductive plating 104. Also in this embodiment, when the knife structure 100 is employed to a wood chipping or wood pulping application, the thermally conductive plating 104 may be worn from the apex region 200 to provide a knife structure 100 having an exposed apex region 200.

In some embodiments, following the thermochemical diffusion treatment, the apex region 200 is an alloy of the base material for the knife body and a boron containing compound. The thermochemical diffusion treatment is only applied to the apex region 200. The thermally conductive plating 104 masks the remainder of the knife structure 100 from being treated by the thermochemical diffusion treatments. In some embodiments, the apex region 200 may be treated with a thermochemical diffusion treatment to form a boron containing compound in the apex region 200 of the knife structure 100. The boron containing compound that is present in the apex region may be selected from the group consisting of FeB, $Fe_2B$, $CrB_2$, NiB, $B_4C$, $VB_2$, $SiB_2$, $ZrB_2$, $YB_6$, $NdB_6$, $CeB_6$, $TiB_2$, MoB, WB, or a combination thereof. This represents only some embodiments of compounds that can be formed by the thermochemical diffusion treatments, in accordance with the present disclosure.

Figure 3:
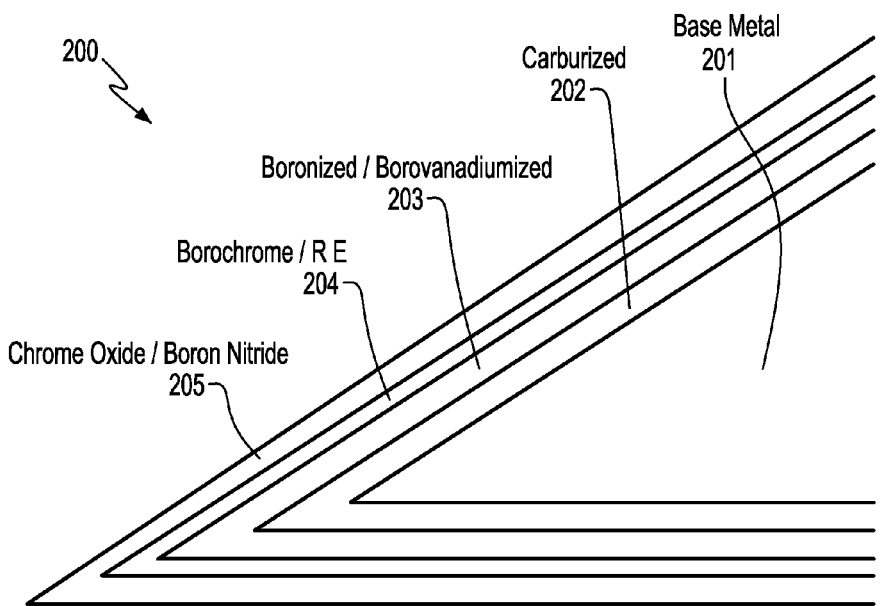
FIG. 3 is a side cross-sectional view of one embodiment of the apex region of the knife body that is depicted in FIG. 1.

Referring to FIG. 3, in some embodiments, the apex region 200 of the knife structure 100 may be multi-layered. For example, the apex region 200 may include a core 201 of the base material for the knife body; and a first layer 202 that is adjacent to the core 201 of the base material. The carbon content of the first layer 202 is greater than the carbon content of the base material for the core 201 of the knife body. In some embodiments, a second layer 203 of an alloy of the base material and the boron containing compound is adjacent to the first layer 202. In some embodiments, a third layer 204 comprising vanadium boride is adjacent to the second layer 203. In some embodiments, a fifth layer 205 of a corrosion protecting composition provides the exterior surface of the apex region 200.

The composition of the core 201 of the base material for the knife body has been described above. For example, the core 201 of the base material for the knife body may be a low carbon steel composition comprising a carbon content of 0.1 wt. %-0.39 wt. %. In another example, the core 201 of the base material may be a medium carbon steel comprising a carbon content ranging from 0.4 wt. %-0.7 wt. %. In yet another example, the core 201 of the base material may be a high carbon steel having carbon (C) present in greater than 0.7 wt % and less than 0.99 wt. %. In yet another example, the core 201 of the base material may be composed of a steel having a carbon content ranging from 0.48 wt. % to 0.52 wt. %, which is one example of a steel composition suitable for knife blades used in wood chipping and pulping operations.

The core 201 of the base material may be 40% to 60% of the cross sectional area of the cross section for the apex region 200 of the knife structure 100. In one embodiment, the core of the base material may be 45% to 55% of the cross sectional area of the cross section for the apex region 200 of the knife structure 100. In one example, the core 201 of the base material may be 50% of the cross sectional area of the cross section for the apex region 200 of the knife structure 100.

The core 201 of the base material may have a Rockwell hardness of 52 Rc to 65 Rc in accordance with ASTM specification E18-11. In another embodiment, the core 201 of the base material may have a Rockwell hardness of 58 Rc to 62 Rc. In one example, the core 201 of the base material may have a Rockwell hardness on the order of 52 Rc to 55 Rc.

The composition of the first layer 202 that is adjacent to the core 201 of the base material it typically a carburized layer. The first layer 202 may have a carbon content that increases the physical properties, such as hardness, of the base material to a value between the mechanical properties, i.e., hardness, of subsequently formed second layer 203 of an alloy of the base material and the boron containing compound, i.e., borided layer, and the core 201 of the base material. The process of carburization works via the implantation of carbon atoms into the surface layers of a metal. As metals are made up of atoms bound tightly into a metallic crystalline lattice, the implanted carbon atoms force their way into the crystal structure of the metal and either remain in solution (dissolved within the metal crystalline matrix) or react with the host metal to form ceramic carbides. Both of these mechanisms strengthen the surface of the metal, the former by causing lattice strains by virtue of the atoms being forced between those of the host metal and the latter via the formation of hard particles.

The first layer 202, i.e. carburized layer, may have a Vickers hardness ranging from 650 HV to 850 HV. In another embodiment, the first layer 202, i.e. carburized layer, may have a Vickers hardness ranging from 675 HV to 825 HV. In another embodiment, the first layer 202, i.e. carburized layer, may have a Vickers hardness ranging from 700 HV to 800 HV. The above-described Vickers hardness values are provided in accordance with ASTM specification E384-11E1 at a load of 10 grams to 100 grams. By increasing the hardness of the base material in the first layer 202, i.e., carburized layer, to be closer to the hardness of the second layer 203, i.e., borided layer, the first layer 202 reduces stresses that can result from large deviations in hardness in layered structures.

The carbon content of the first layer 202 is greater than the carbon content of the base material for the core 201 of the knife body. The first layer 202 has a carbon content that increases the physical properties, such as hardness, of the base material to a value between the mechanical properties, i.e., hardness, of subsequently formed second layer 203 of an alloy of the base material and the boron containing compound, i.e., borided layer, and the core 201 of the base material. For example, in one embodiment, in which the carbon content of the base material of the core 201 ranges from 0.1 wt. % to 0.99%, the carbon content of the first layer 202 ranges from 0.75% to 1.25%. In another embodiment, the carbon content of the first layer 202 ranges from 0.65% to 0.75%. In some examples, the carbon that has been introduced to the carburized layer forms carbides having a $Fe_3C$ (cementite) structure. The carbide may be present in the first layer 202 present in an amount as great as 25% by volume. In one embodiment, the carbide is present in the first layer 202 in an amount ranging from 5% to 20% by volume. In another embodiment, the carbide that is present in the first layer 202 is in an amount ranging from 10% to 15%. Other carbides that may be present in the first layer 202 may include chromium (Cr) carbide or vanadium (V) carbide. The carbides can include elements provided by the base material or introduced using a thermochemical diffusion process. In some embodiments, the first layer 202 may include vanadium carbide in an amount as great as 5% by volume.

The first layer 202, i.e., carburized layer, may be 10% to 20% of the cross sectional area of the cross section for the apex region 200 of the knife structure 100. In one embodiment, the first layer 202, i.e., carburized layer, may be 12% to 18% of the cross sectional area of the cross section for the apex region 200 of the knife structure 100. In another embodiment, the first layer 202, i.e., carburized layer, may be 15% to 17% of the cross sectional area of the cross section for the apex region 200 of the knife structure 100.

The composition of the second layer 203, i.e., borided layer, that is adjacent to the first layer 202, i.e., carburized layer, is typically 100% borided material. The terms "borided", "boronizing" or "boriding" denote a surface treatment that has been applied to a knife structure, in which boron (B) atoms are diffused into the surface of a metal of the knife structure to form borides. In one embodiment, in which the metal knife structure 100 includes iron (Fe), such as steel, borides produced by boronizing may include iron boride (FeB) and/or iron-II-boride (Fe2B). In some embodiments, the boronizing process in ferrous metals, such as steel, generally consists of two stages. The first stage of the boronizing process can include the deposition of a single molecular boron (B) compound layer of iron boride (FeB) created between the reactant and the metal work piece surface (metal surface). The nucleation of this new boron compound crystal seed, i.e., boride, is on the surface of the metal work piece and it is a function of time and temperature. After a complete layer of the boron compounds have been established on the surface, the second stage of the boronizing process can begin. The second stage of the boronizing process may include the diffusion of the boron compounds into the metal work piece, i.e., knife structure 100, which in some embodiments can provide a borided single or double layer with improved hardness and improved wear-resistance, as well as a corrosive barrier. The total thickness of the borided layer at a constant temperature can be calculated by the formula: d=k square root of t, where d is the boron layer depth in microns (μm), k is the constant dependent temperature, and t is the time in seconds at that given temperature. The boron containing compound that is present in the second layer 203 of the alloy of the base material and the boron containing compound, i.e., borided layer, may be selected from the group consisting of iron boride (FeB), iron-II-boride ($Fe_2B$), and a combination thereof.

In some examples, the second layer 203 of the alloy of the base material and the boron containing compound may further include a boride selected from the group consisting of $CrB_2$, NiB, $B_4C$, $VB_2$, $SiB_2$, $ZrB_2$, $YB_6$, $NdB_6$, $CeB_6$, $TiB_2$, MoB, WB, or a combination thereof. In one example, the second layer 203 of the alloy of the base material and the boron containing compound may further include vanadium boride. In some embodiments, the third layer 204 composed of vanadium boride comprises a source material selected from the group consisting of ferro vanadium, vanadium (V) metal, vanadium pentoxide ($V_2O_5$) and combinations thereof, a reactant selected from the group consisting of $NH_4Cl_3$, $KBF_4$, $CeCl_3$ and combinations thereof, and a scavenger of $Al_2O_3$.

In one embodiment, the vanadium boride is present in the second layer 203 having a gradient with a low concentration in the lower portion of the second layer 203 that has an interface with the first layer 202, i.e., carburized layer, and a high concentration in an upper portion of the second layer 203 that has an interface with the later described third layer 204, i.e., boronized layer with additions of chrome and rare earth elements. For example, the concentration of vanadium boride within the second layer 203 proximate to the interface with the later described third layer 204 may be on the order of 60%, while the concentration of vanadium boride proximate to the interface with the first layer 201 may be on the order of 5%.

In the case of the treatment of a knife edge that may be subjected to significant stresses caused by impact, the vanadium boride can improve impact strength, by the addition of vanadium (V) to the boronizing layer. In some embodiments, the introduction of vanadium (V) into a previously borided layer toughens the boronized layer. For example, vanadium can come from the composition of the base metal or can be added as a component of the thermochemical diffusion treatments that are applied to the apex region 200. Vanadium is capable of taking atoms of nonmetals into its lattice. Typically, such uptake is accompanied by a change in the packing pattern to a cubic close-packed structure. Their composition is determined by geometrical packing arrangements rather than by valence bonding. Interstitial compounds may be formed when an atom of sufficiently small radius sits in an interstitial hole in a metal lattice. In some embodiments, as all possible vacant lattice sites need not be filled, the compositions display a range of nonmetal content up to the theoretical limit. The sites that are not filled when duplicated M random order, can act similar to the micro and nano inclusions induced by the addition of metastable yttria zirconia.

In the case of borovanadiumizing, the cubic close packed structure allows for the intermetallic atoms of elemental boron (B), which can form clusters reminiscent of molecules that are electron deficient. The intermetallic atoms of elemental boron (B) that form clusters reminiscent of molecules react within the vanadium lattice by means of interstitial bonding are not dependent on covalent or metallic charged bonding. This accounts for its higher hardness of vanadium boride, which is a stronger and more stable structure than the covalent bonding of iron boride (FeB) and iron-II-boride ($Fe_2B$) by themselves. In vanadium monoboride (VB), the boron atoms form a zigzag chain. In vanadium diboride ($VB_2$), the interstitial boron atoms are linked in a layer of hexagons. The second layer 203, i.e., boronized layer, may include both vanadium monoboride (VB) and vanadium dihoride ($VB_2$).

The portions of the second layer 203, i.e., borided layer, having a high concentration of vanadium boride may have a greater hardness than the portions of the second layer 203, i.e., borided layer, with a lower concentration of vanadium boride. The portions of the second layer 203, i.e., borided layer, having a high concentration of vanadium boride have a greater resistance to impact force without spalling and/or chipping than the portions of the second layer 203, i.e., borided layer, having a lower concentration of vanadium boride. By "high concentration" of vanadium boride it is meant that the concentration of vanadium boride in the portion of the second layer 203 is closer to 60% than 5%. By "low concentration" of vanadium boride it is meant that the concentration of vanadium boride in the portion of the second layer 203 is closer to 5% than 60%.

The portions of the second layer 203, i.e., borided layer, having a high concentration of vanadium boride may have a Vickers hardness ranging from 2,400 HV to 3,700 HV. In another embodiment, the portions of the second layer 203, i.e., borided layer, having a high concentration of vanadium boride may have a Vickers hardness ranging from 2,800 HV to 3,500 HV. In yet another embodiment, the second layer 203 having a high concentration of vanadium boride may have a Vickers hardness ranging from 1,900 HV to 2,000 HV.

The portions of the second layer 203, i.e. borided layer, having a low concentration of vanadium boride may have a Vickers hardness ranging from 1,700 HV to 2,100 HV. In another embodiment, the portions of the second layer 203, i.e. borided layer, having a low concentration of vanadium boride may have a Vickers hardness ranging from 1,800 HV to 2,100 HV. In yet another embodiment, second layer 203, i.e. borided layer, having a low concentration of vanadium boride may have a Vickers hardness ranging from 1,900 HV to 2,000 HV.

The second layer 203, i.e., borided layer, may be 10% to 20% of the cross sectional area of the cross section for the apex region 200 of the knife structure 100. In one embodiment, the second layer 203, i.e., borided layer, may be 12% to 18% of the cross sectional area of the cross section for the apex region 200 of the knife structure 100. In another embodiment, the second layer 203, i.e., borided layer, may be 15% to 17% of the cross sectional area of the cross section for the apex region 200 of the knife structure 100.

A third layer 204, i.e., boronized layer with additions of chromium and rare earth elements, may be present adjacent to the second layer 203. The addition of chrome and trace rare earth elements to a boronized layer may result in a material that is less effected by impact forces. To improve the durability of the knife structure 100, the addition of chrome (Cr) combined with yttria (Y), metastablized zirconia where the yttria content is at a percentage greater than 3% and less than 30%. This addition of the yttria zirconia ceramic manifests in high ratios of nano and micro inclusions in the boronized layer. This phenomena in turn stabilizes the energy transport potential of this very hard and brittle layer such that stress induced crack propagation is limited in length of travel because of the breaks created by the nano and micro inclusions, there by improving the wear properties of the knife structure 100. The rare earth elements in the third layer 204 may be present in a concentration ranging from 5.0% to 12.0%.

In some embodiments, the formation of the boronized layer has a priority along a columnar crystal orientation, which is perpendicular to the surfaces of the boronized parts. The columnar iron-II-boride ($Fe_2B$) phase can break easily under an impact stress, because there exists a weak boron-boron (B—B) bond along the columnar crystal. The rare earth (RE) metal elements can promote the diffusion of boron (B) atoms in steel at the boronizing temperature, and rare earth and chrome elements can also enter into the iron-II-boride ($Fe_2B$) phase during powder rare earth-chrome-boronizing, thus purifying grain boundaries, equalizing force energies separated by the grain boundary, and fining crystal grains of columnar iron-II-boride ($Fe_2B$) phase. Rare earth (RE) and chrome (Cr) atoms can dissolve in iron-II-boride ($Fe_2B$) columnar crystal, forming the interstitial solid solution and intensifying B—B bond along the columnar crystal. In particular, the valence electron structure of iron-II-boride ($Fe_2B$) phase may be improved, and eigen-brittleness of iron-II-boride ($Fe_2B$) phase can be decreased, due to the intensifying of the B—B bond that results form the addition of rare earth elements and chrome atoms. The addition of micro elements of rare earth and chrome may enhance grain refinement along with purifying the boundaries. Therefore, the iron-II-boride ($Fe_2B$) phase containing rare earth (RE) elements and chrome (Cr) elements have increased mechanical properties, such as impact strength, when compared to a pure iron-II-boride ($Fe_2B$) phase.

The chromium element of the third layer 204 of the knife structure 100 may be selected from the group consisting of ferro chrome, chrome oxide, chromic acid, chrome carbide, chrome containing alloys and combinations thereof. In some embodiments, the chromium element provides chromium diboride. The chromium diboride increases hardness and may allow for the dissipation of energy in impact scenarios and retained stress by allowing for slip between compositions of a crystal containing chromium diboride separated by a grain boundary and a crystal having a composition of $Fe_2B$ as the borided material, i.e., second layer 203, reaches the yield point of the grain boundaries when under stress. More specifically, in some embodiments, dispersed crystals of chromium diboride having a high hardness in compared to a matrix of iron boride crystals allows for slip along grain boundaries between the two phases. This provides for a means of energy dissipation, so that stresses may be relieved, which could otherwise facilitate failure of the knife structure on a macro scale.

The rare earth element of the third layer 204 of the knife structure 100 may be selected from the group consisting of lanthanum, cerium, neodymium, samarium, europium, dysprosium, holmium, erbium, thulium, ytterbium, lutetium, and a combination thereof. In one example, cerium oxide may function as a grain refiner for the composition of the second layer 203. For example, the cerium (Ce) of the cerium oxide can act as a wedge in the grain boundaries of the steel, in which the cerium (Ce) allows for the boron of the boriding operation, which diffuses by traveling along the grain boundary, to come into contact with more surface area of iron (Fe).

The cerium (Ce) can act as a wedge in the grain boundaries because of its large size. The boron diffuses along the increased length of the proportional boundary created by the large rare earth element, such as cerium (Ce), but this also increases the velocity of the boron that is traveling along this longer or stretched surface of iron. This facilitates the ongoing composition of $Fe_2B$ because the rate of reaction is slowed by increased velocity of boron in contact with more surface area of iron. This improves efficiency of diffusion while allowing for a consistent formation of the desired iron II boride.

The third layer 204, i.e., boronized layer with additions of chromium and rare earth elements, may be 10% to 20% of the cross sectional area of the cross section for the apex region 200 of the knife structure 100. In one embodiment, the third layer 204, i.e., boronized layer with additions of chromium and rare earth elements, may be 12% to 18% of the cross sectional area of the cross section for the apex region 200 of the knife structure 100. In another embodiment, the third layer 204, i.e., boronized layer with additions of chromium and rare earth elements, may be 15% to 17% of the cross sectional area of the cross section for the apex region 200 of the knife structure 100.

The fourth layer 205 provides the exterior surface of the apex region 200 of the knife structure. The fourth layer 205 is composed of a corrosion protecting composition, which may be a ceramic or non-ceramic material. Examples of ceramic materials that are suitable for the fourth layer 205 may be one of boron nitride, boron carbide, silicon carbide, and combinations thereof. Examples of non-ceramic materials that are suitable for the fourth layer 205 may be one of $WS_2$, and $MoS_2$. In one example, the fourth layer 205 may be composed of chrome monoxide ceramic. Chrome monoxide ceramic has properties suitable for corrosive and high temperature applications that are subject to high wear, such as knives for wood processing applications. For example, with the composition of the wood being cut by the knife structure 100 is on the order of 40% water by weight, there may be significant possibilities for additional detrimental effects caused by corrosion. At the point of impact of the knife structure 100 to a wood product there may be ample energy in the form of compression, friction, and vacuum that micro vapor particles of steam may be present tangent to the cutting edge, i.e., apex region 200 of the knife structure 100. The steam in the presence of pine and other species of wood sap can greatly amplify the corrosion potential on such a thin cross section as the apex region 200 of the knife structure 100. The presence of water bubbles may also present the potential for cavitation. Chrome monoxide ceramic, as well as the other corrosion protecting composition described above, can provide the knife structure 100 with resistance to these corrosion effects.

The fourth layer 205 of the corrosion protecting composition may be 1% to 10% of the cross sectional area of the cross section for the apex region 200 of the knife structure 100. In one embodiment, the fourth layer 205 of the corrosion protecting composition may be 1% to 5% of the cross sectional area of the cross section for the apex region 200 of the knife structure 100. In another embodiment, the fourth layer 205 of the corrosion protecting composition may be 2% to 3% of the cross sectional area of the cross section for the apex region 200 of the knife structure 100.

Figure 4A:
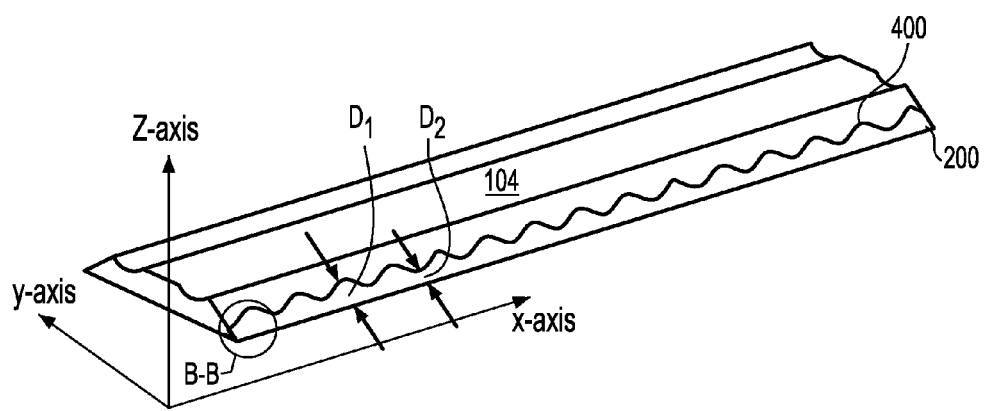
FIG. 4A is a perspective view depicting one embodiment of a hamon region of the knife structure, in accordance with the present disclosure.
Figure 4B:
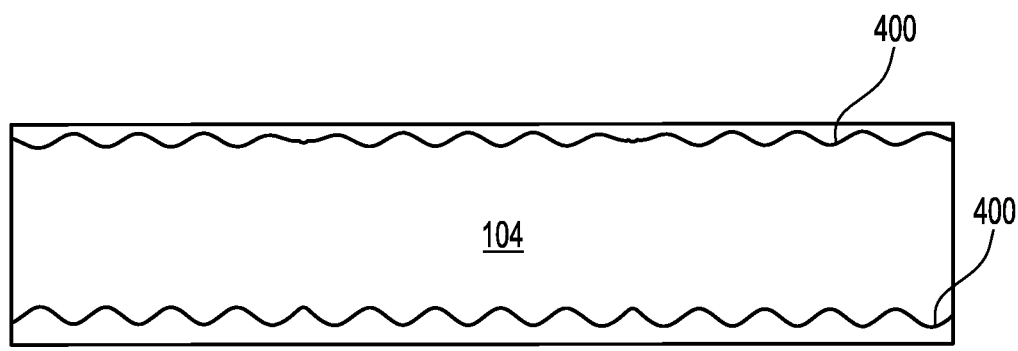
FIG. 4B is a top down perspective view depicting one embodiment of a hamon region of the knife structure.
Figure 4C:
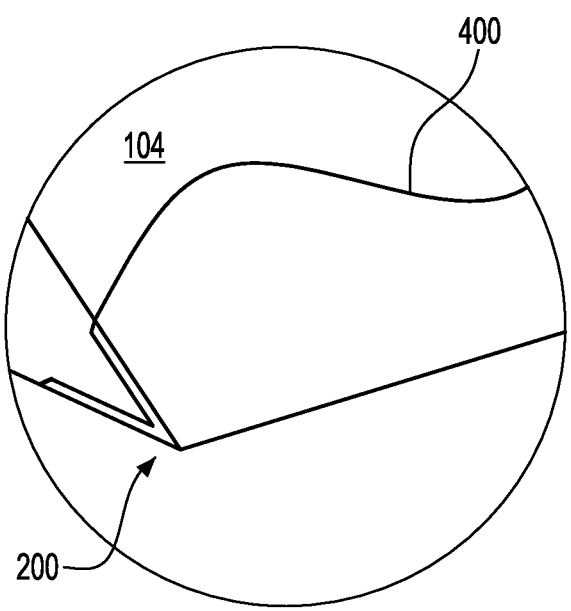
FIG. 4C is a magnified view of the corner portion of the knife structure including the hamon region that is depicted in FIG. 4A.

FIGS. 4A-4C depict one embodiment of a hamon region that is positioned between the apex region 200 of the knife structure 100 and the portion of the knife structure 100 that is plated with the thermally conductive plating 104. The hamon region extends from the apex region 200 of the knife to the thermally conductive plating 104. The interface between the hamon region and the thermally conductive plating 104 is provided by a non-repeatable, non-linear demarcation line 400. By "non-linear" it is meant that the demarcation line 400 has a curvature. By "non-repeatable" it is meant that the demarcation line does not have a repeating pattern. In one example, the dimension D1, D2 separating the edge of the cutting surface 102 from the non-repeatable, non-linear demarcation line 400 may range from the 3 mm to 5 mm. For example, a greater dimension D1 separating the cutting surface 102 from the non-repeatable, non-linear demarcation line 400 extends from a concave curvature of the non-repeatable, non-linear demarcation line 400 to the cutting surface 102 by a dimension on the order of 5 mm, e.g., ranging from 4 mm to 6 mm. For example, a lesser dimension D1 separating the cutting surface 102 from the non-repeatable, non-linear demarcation line 400 extends from a convex curvature of the non-repeatable, non-linear demarcation line 400 to the cutting surface 102 by a dimension on the order of 3 mm, e.g., ranging from 2 mm to 4 mm. The wave-like geometry provided by the non-repeatable, non-linear demarcation line 400 facilitates the formation of thermochemical diffusion treatment regions within the knife body that are adjacent to regions in the knife body that are not treated with a thermochemical diffusion treatment. The demarcation line 400 of the hamon region depicted in FIGS. 4A-4C does not appear to allow stresses to build up within the knife structure 100 that could facilitate a crack that could follow a straight line and cause catastrophic failure of the knife structure 100.

The thermally conductive plating 104 functions as a mask during the thermochemical diffusion treatments of the apex region 200 of the knife structure 100. In some embodiments, the thermally conductive plating 104 prevents the entire surface of the knife structure 100 from being hardened by the thermochemical diffusion elements applied to the apex region 200, and therefore increases the service life of the knife structure 100. More specifically, in one embodiment, the thermally conductive plating 104 at the interface of the non-repeatable, non-linear demarcation line 400 produces regions of the knife body that are treated during the thermochemical diffusion treatment to have increased mechanical performance in comparison to the base material of the knife body that are adjacent to regions of the knife body that are not treated. The regions of the knife body that are not treated are underlying a portion of the thermally conductive plating 104. For example, the addition of thermochemical diffusion elements, such as carbon (C), chrome (Cr), yttrium (Y), boron (B), and vanadium (V), to the apex region 200 of the knife structure 100 increases the mechanical properties, such as hardness, of the apex region 200. Increases in hardness are typically associated with an increase in brittleness. A very high hardness may facilitate failure, because a material that has a very high hardness may also be brittle. The masking provided by the thermally conductive plating 104 provides a gradient of thermochemical diffusion elements (also referred to as alloying elements) within the hamon region. More specifically, in one embodiment, the masking provided by the thermally conductive plating 104 during the thermochemical diffusion treatments can provide successive regions of alternating high hardness and low brittleness. This can provide regions of the knife body having a high hardness adjacent to regions of the knife body having a high ductility. This change in knife properties along the knife body can act as an obstruction to straight line crack propagation.

In some embodiments, the change in the concentration of the thermochemical diffusion elements from the apex region 200 may be prevalent in the x-axis, y-axis and z-axis, as depicted in FIG. 4A. The distance over which the thermochemical diffusion elements are present in decreasing gradient from the apex region 200 may range from 40 microns to 120 microns in the direction of the y-axis. In some embodiments, the delta between the 40 to 120 microns along the y-axis is consistent with the non-linear non-repeatable wave pattern that is established by the thermochemical diffusion process including the boron containing form, as will be described below.

The plane running the length of the apex diffusion zone along the x-axis also varies in concentration gradient of the thermochemical diffusion elements similar to the gradient for the thermochemical diffusion elements along the y-axis. Because the gradient for the thermochemical diffusion elements is non-repeatable for the entire length of the hamon region, the chemistry variation may be from 40 mm to 500 mm, which may vary depending on the overall length of the hamon region. The depth of thermochemical diffusion elements along the z-axis occupies an area approximately 50% of the total volume of the apex region 200. In some embodiments, the physical and mechanical properties will vary in this plane based upon percentage of desired engineered composites in percentage of treated area, i.e., the apex region 200. The difference in the gradient of the thermochemical diffusion elements along the directions of the x-axis, y-axis and z-axis provides a multi-directional change in mechanical properties in the knife structure 100 extending from the knife structure's apex region 200.

The gradient of thermochemical diffusion elements that is present proximate to the hamon region may also be referred to as a "diffused zone of alloying elements". In some embodiments, the diffused zone of alloying elements obstructs crack propagation. One of the main constituents that determine the ability for the continued movement of a crack, is the crack's stress intensity factor, which is influenced by the geometry and quantity of potential stored energy. Failure comes with the releases of the potential energy into kinetic energy. Retarding the transition between potential energy and kinetic energy is what can be accomplished by deviating the regional mechanical properties in a micro zone of the stress strain values with varying tensile, compression, and shear values, due to different hardness, different thermal coefficients, and different bond energies etc., for each of the material layers that are diffused into the apex region 200 of the knife structure 100. In some embodiments, this is what is provided by the multi-directional change in mechanical properties in the knife structure 100 that is produced by the diffused zone of alloying elements in the hamon region. With each rotation of the wood processing apparatus, such as a wood chipper, that is employing the knife structure 100, new impact energies and added heat energies accumulate in the apex region 200 of the knife structure 100 waiting to be released. The multi-directional, change in mechanical properties of the hamon region retards the inertia of momentum in the direction the crack may be traveling. Therefore, in some instances, the hamon region obstructs the incidence of crack propagation within the knife structure In another aspect of the present disclosure, a process flow is provided for forming a knife structure 100 including the thermally conductive plating 104, the thermochemically hardened apex region 200 of the knife structure 100, and the hamon region (extending from the apex region 200 to the demarcation line 400). In one embodiment, the process flow is consistent with the flow chart depicted in FIG. 5. In one embodiment, the process flow may begin with machining and cleaning a knife structure 100 including an apex region 200, a cutting surface 101, a release surface 102, and a knife clamp surface 103. For example, when the knife structure 100 is employed in wood chipping, debarking, sawmill, a physical machining process may be applied to the knife structure 100, such as a grinding or straightening process. In one embodiment, in which the metal work piece 10 is a knife, such as a wood chipping knife, the machining process may restore the sharpness of the cutting surface. For example, a series of grinders and polishing stones may be applied to restore the sharpness of the cutting surface. Electrochemical machining processes may also be applied to knife structure 100. It is noted that the above description of machining processes is not limiting, as other machining processes are suitable for being applied to the knife structure 100. For example, when restoring the cutting surface of a knife structure 100, e.g., wood chipping knife, any machining process that can be characterized as burnishing, shot peening, smoothing, polishing and lapping are within the scope of the present disclosure, as a machining process in accordance with step 110 of FIG. 5. In one example, prior to plating of the knife structure 100, the relief surface 102 and the cutting surface 101 is finished to a surface of less than 8 RMS, and the clamp surface 103 is finished to a surface greater than 16 RMS.

Figure 5:
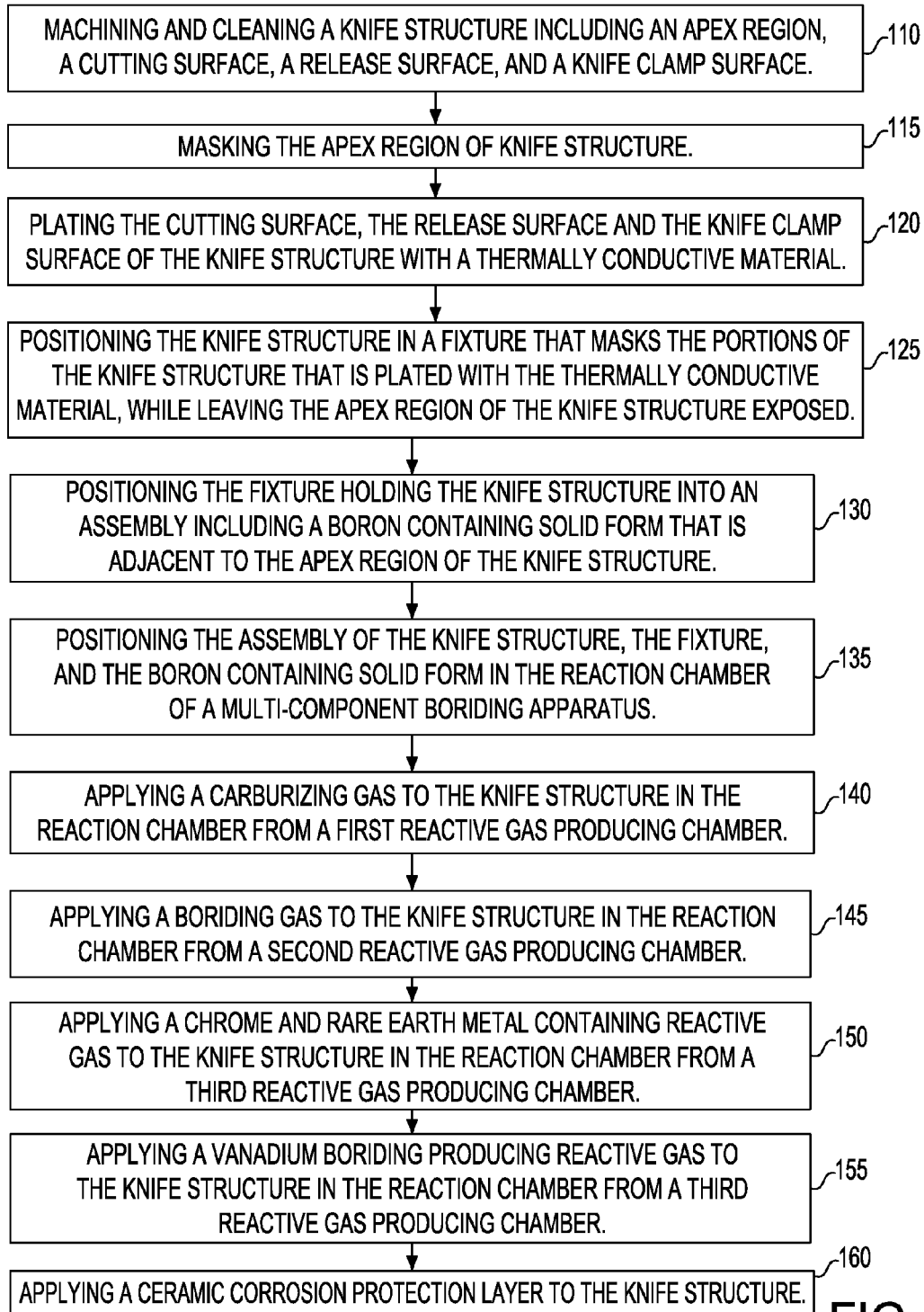
FIG. 5 is a flow chart depicting a process flow for forming a knife structure, in accordance with one embodiment of the present disclosure.

Following machining, a cleaning process may be applied to the knife structure 100, such as a chemical cleaning process or an electro-chemical cleaning process. In one embodiment, the cleaning process may include a de-oxidation step. For example, the cleaning process may include acidic cleaners, alkaline cleaners, and combinations thereof. In another example, the cleaning process may employ one of hydrofluoric acid or phosphoric acid. In some examples, the machining and cleaning processes of step 110 may be omitted from the process flow that is depicted in FIG. 5.

Following cleaning, the apex region 200 of the knife structure 100 may be masked and prepared for the plating process that forms the thermally conductive plating 104. The mask obstructs the thermally conductive plating 104 from being formed on the apex region 200. In one embodiment, masking can be accomplished by dipping the apex region 200 of the knife structure 100 into a liquid that then dries to a solid (lacquer or some rubbers). In other embodiments, the masking may be applied by brushing and/or spraying methods. In some other embodiments, a metal mask can be positioned over the apex region 200 of the knife structure 100 during the plating process. The metal mask can be stamped out of shim stock and pressed or clipped onto the apex region 200 of the knife structure 100. The metal mask may be plated, but the apex region 200 that is under the metal mask is protected from being plated. The masking is typical composed of an elastomer. An elastomer is a cross-linked, amorphous polymer when above its glass transition temperature. Each of the monomers, which link to form the polymer in an elastomer is usually made of carbon, hydrogen, oxygen and/or silicon. Vinyls and latex are suitable for use with the present disclosure. Specific examples of elastomers that may be suitable for use with the present dislosure include silicone rubber; natural polyisoprene: cis-1,4-polyisoprene natural rubber (NR) and trans-1,4-polyisoprene gutta-percha; synthetic polyisoprene (IR for Isoprene Rubber); polybutadiene (BR for Butadiene Rubber); chloroprene rubber (CR), polychloroprene, neoprene, baypren etc; butyl rubber (copolymer of isobutylene and isoprene, IIR); halogenated butyl rubbers (chloro butyl rubber: CIIR; bromo butyl rubber: BIIR); styrene-butadiene rubber (copolymer of styrene and butadiene, SBR); nitrile rubber (copolymer of butadiene and acrylonitrile, NBR)(also called Buna N rubbers); hydrogenated nitrile rubbers (HNBR); therban; zetpol; EPM (ethylene propylene rubber, a copolymer of ethylene and propylene) and EPDM rubber (ethylene propylene diene rubber, a terpolymer of ethylene, propylene and a diene-component); Epichlorohydrin rubber (ECO); Polyacrylic rubber (ACM, ABR); Silicone rubber (SI, Q, VMQ); Fluorosilicone Rubber (FVMQ); Fluoroelastomers (FKM, and FEPM) Viton, Tecnoflon, Fluorel, Aflas and Dai-El; Perfluoroelastomers (FFKM) Tecnoflon PFR, Kalrez, Chemraz, Perlast; Polyether block amides (PEBA); Chlorosulfonated polyethylene (CSM); Ethylene-vinyl acetate (EVA) thermoplastic elastomers (TPE); the proteins resilin and elastin; and polysulfide rubber. The mask is generally peeled off after plating.

Following masking of the apex region 200, the process flow continues at step 120, which includes plating the cutting surface 101, the release surface 102 and the knife clamp surface 103 of the knife structure 100 with a thermally conductive plating 104. The mask that is formed at step 115 obstructs the thermally conductive plating 104 from being formed on the apex region 200 of the knife structure 100. "Plating" is a surface covering process, in which a metal is deposited on a conductive surface. Some examples of plating including electroplating and electroless plating. In electroplating, an ionic metal is supplied with electrons to form a non-ionic coating on a substrate, e.g., the exposed portions of the knife structure 100. In some embodiments, the electroplating system may include a chemical solution with the ionic form of the metal, an anode (positively charged) which may consist of the metal being plated (a soluble anode) or an insoluble anode (usually carbon, platinum, titanium, lead, or steel), and finally, a cathode (negatively charged) where electrons are supplied to produce a film of non-ionic metal. Electroless plating, also known as chemical or auto-catalytic plating, is a non-galvanic plating method that involves several simultaneous reactions in an aqueous solution, which occur without the use of external electrical power. The reaction is accomplished when hydrogen is released by a reducing agent, normally sodium hypophosphite, and oxidized, thus producing a negative charge on the surface of the part. In addition to electroplating and electroless plating, the thermally conductive plating may also be deposited using sputtering, chemical vapor deposition, ion implantation, friction welding or a combination of the aforementioned plating methods.

In some embodiments, the thermally conductive plating is composed of copper. Copper electroplating uses electrical current to transfer copper from a copper cathode via electrolysis to the anode, made of another metal, which in this case may be the knife structure 100. This requires an electrolyte solution, such as salt water or a copper sulfate solution. Thermally conductive plating of copper from copper sulfate allows the electroplating process to harness the elemental copper within the copper sulfate rather than using a copper anode itself for the task. It is noted that the above description of copper electroplating for providing the thermally conductive plating 104 is provided for illustrative purposes only, and is not intended to limit the present disclosure. For example, the thermally conductive plating 104 may be composed of any material described above with reference to FIGS. 1 and 2, and may be deposited using any of the aforementioned methods, as well as others not specifically disclosed. During the plating process the mask ensure that the thermally conductive plating 104 is not formed on the apex region 200 of the knife structure 100. Following plating the mask may be removed to expose the apex region 200 for treatment with a thermochemical diffusion process that increases the mechanical properties of the apex region 200. In the embodiments, in which the thermally conductive plating 104 is selected from the group consisting of aluminum nitride, boron nitride, and silicon carbide, the thermally conductive plating 104 may be deposited using chemical vapor deposition and/or physical vapor deposition methods. In one embodiment, the thermally conductive plating 104 has a thickness ranging from 5 microns to 120 microns. In another embodiment, the thermally conductive plating 104 has a thickness ranging from 10 microns to 110 microns. In yet another embodiment, the thermally conductive plating 104 has a thickness ranging from 20 microns to 100 microns.

Referring to step 125 of the process flow depicted in FIG. 5, the knife structure 100 that has been plated with the thermally conductive plating 104 may then be positioned within a fixture that masks the portion of the knife structure 100 that has been plated with the thermally conductive plating 104. Typically, the fixture is a component of an assembly including a boron containing solid form 50 that is employed in the later described boriding process at step 145. One embodiment of the assembly including the boron containing solid form 50 is depicted in FIGS. 6A-6F. The boron containing solid form 50 is positioned within the reactor chamber 15 of the multi-component boriding apparatus 500 that is depicted in FIG. 7 for the thermochemical diffusion treatments that are later applied to the knife structure 100. The term "multi-component boriding" refers to multiple treatments of thermochemical diffusion into a metal work piece 10 that includes boron (B) for boronizing with at least one other element to be introduced to the metal work piece 10 by thermochemical diffusion. In this embodiment, boronizing is only one step in the process. Some common multi-component surfaces treatments include at least one of boroaluminizing, borosiliconizing, borochromizing, borovanadizing, and borochromvanadizing.

Boroaluminizing is a metal surface treatment, e.g., thermochemical diffusion process, where both boron (B) and aluminum (Al) are diffused into the surface of a metal work piece 10, such as an iron (Fe) containing metal work piece, e.g., steel. In some examples, boroaluminizing provides a surface having improved oxidizing resistance in wet conditions, when compared to the performance of the base material prior to boroaluminizing. Borosiliconizing is a metal surface treatment, e.g., thermochemical diffusion process, where both boron (B) and silicon (Si) are diffused into the surface of a knife structure 100, such as an iron (Fe) containing knife structure 100, e.g., steel. In some examples, the borosiliconizing provides a surface having improved corrosion fatigue strength, when compared to the performance of the base material prior to borosiliconizing. Borochromizing is a metal surface treatment, e.g., thermochemical diffusion process, where both boron (B) and chromium (Cr) are diffused into the surface of the knife structure 100, such as an iron (Fe) containing knife structure 100, e.g., steel. In some examples, the borochromizing provides a surface with better oxidizing resistance than boroaluminizing at elevated temperatures, preferably resulting in a very uniform layer and improves wear resistance beyond that of boron alone.

Borovanadizing is a metal surface treatment, e.g., thermochemical diffusion process, where both boron (B) and vanadium (V) are diffused into the surface of the metal work piece, such as an iron (Fe) containing knife structure 100, e.g., steel. In some examples, the boronvanadized surface has a high hardness, when compared to the base metal prior to being borovanadized, but with higher ductility and toughness, thereby reducing spalling under impact applications. Borochromvanadizing is a metal surface treatment, e.g., thermochemical diffusion process, where boron (B), chromium (Cr) and vanadium (V) are diffused into the surface of the knife structure 100, such as an iron (Fe) containing knife structure 100, e.g., steel. In some examples, the boronchromvanadizing provides a high level of hardness and provide corrosion resistance against most acids. The thermochemical diffusion treatments for some embodiments of the present disclosure are further described in steps 145, 150 and 155 of the process flow depicted in FIG. 5.

Figure 6A:
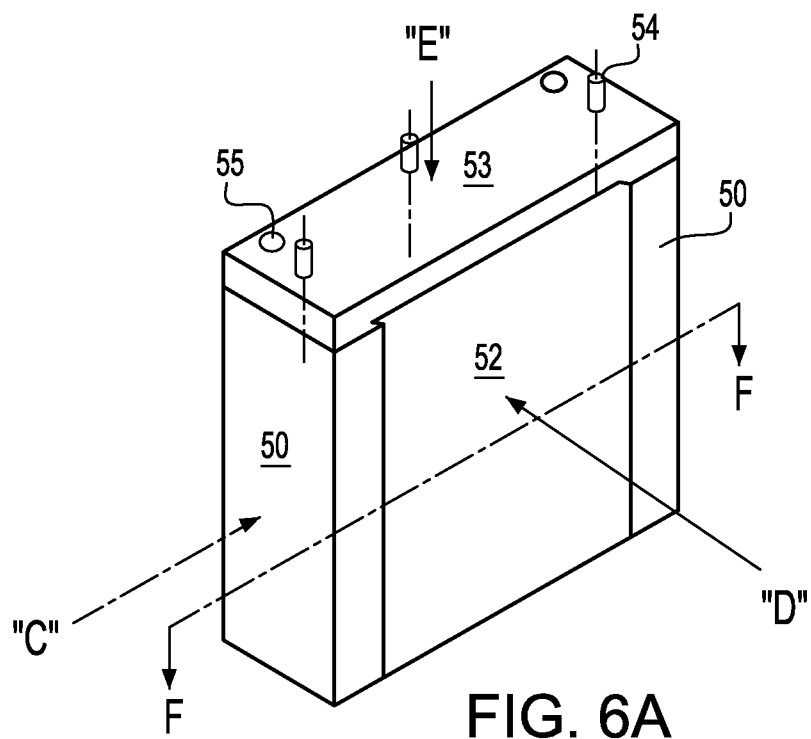
FIG. 6A is a perspective view of one embodiment of a boride containing solid form is housing a knife structure to be treated by the multi-component boriding apparatus, in accordance with the present disclosure.
Figure 6B:
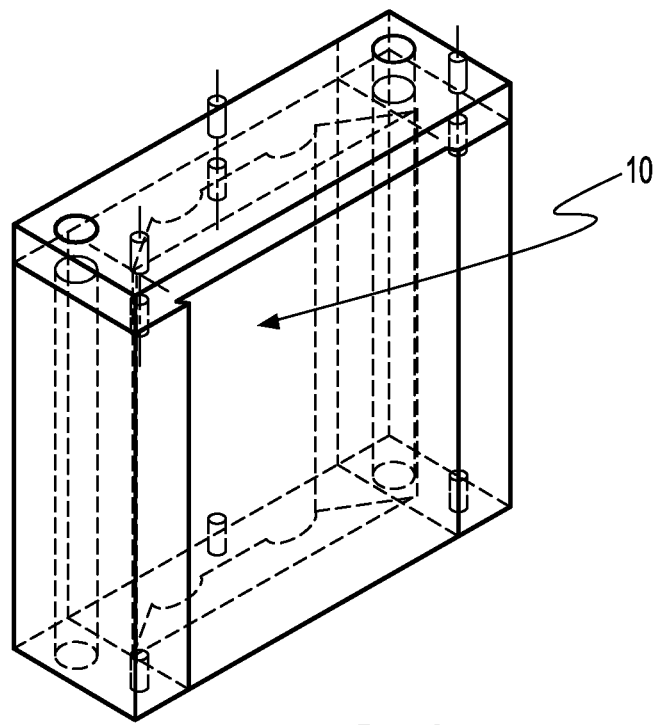
FIG. 6B is a perspective view of one embodiment of a boron containing solid form that is depicted in FIG. 6A, wherein the knife structure being housed within the boron containing solid form is depicted with broken lines, in accordance with the present disclosure.
Figure 6C:
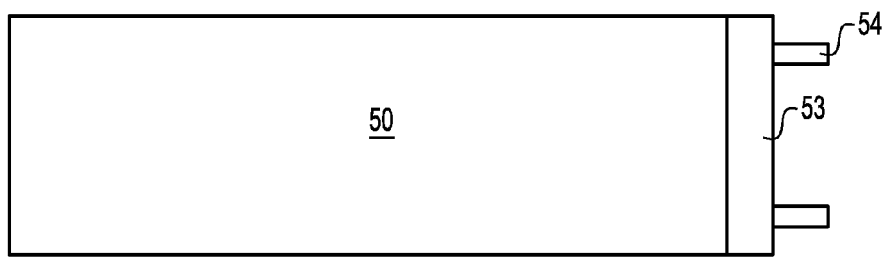
FIG. 6C is a side view of the boron containing solid form from the viewpoint identified by "C" in FIG. 6A.
Figure 6D:
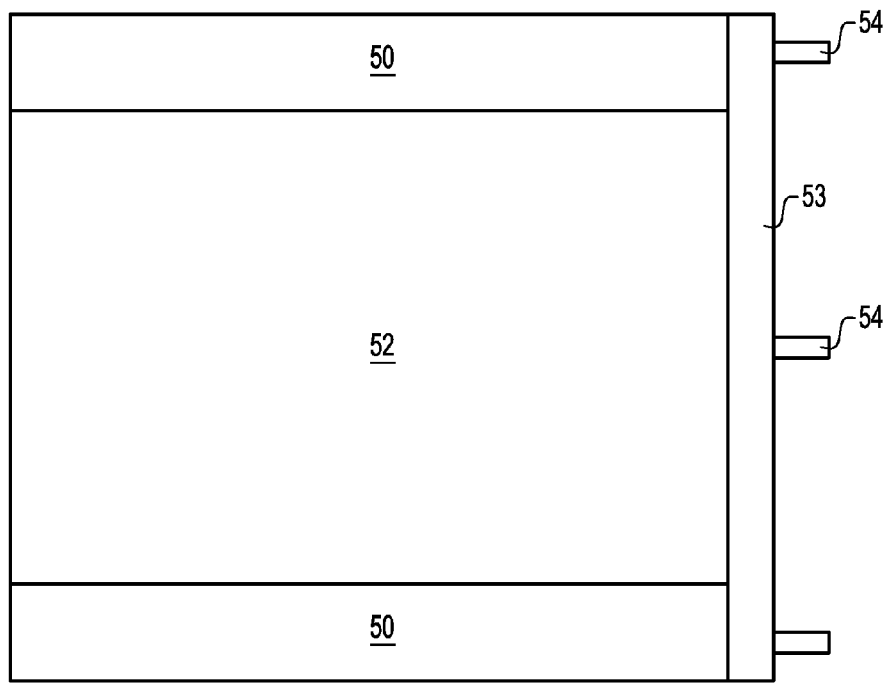
FIG. 6D is a side view of the boron containing solid form from the viewpoint identified by "D" in FIG. 6A.
Figure 6E:
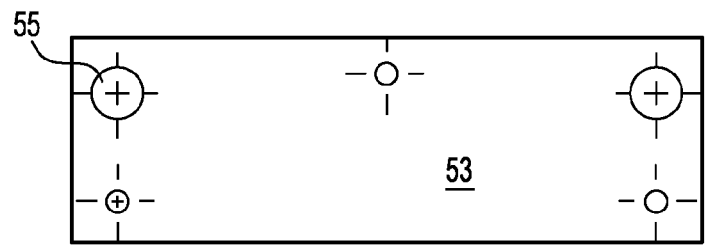
FIG. 6E is a top down view of the boron containing solid form from the viewpoint identified by "E" in FIG. 6A.

Referring to FIGS. 6A-6F, in one embodiment, the fixture that the plated knife structure 100 is positioned within includes a body portion 52, a cap portion 53 and sidewalls that are provided by the boron containing solid form 50. The body portion 52 of the assembly provides the fixture. In some examples, the body portion 52 and the cap portion 53 of the assembly including the boron containing solid form 50 may be integrated into a single unitary structure. The body portion 52 of the assembly typically houses knife structure 100, and positions the knife structure 100 so that the portions of the metal work piece 10 that are to be treated by the thermochemical diffusion processes are adjacent to the sidewall elements of the assembly that are provided by the boron containing form 50. Only the apex region 200 of the knife structure extends from the body portion 52, i.e., fixture, of the assembly into a treatment region 51 of the boron containing solid form 50. In some embodiments, the body portion 52, i.e., fixture, of the assembly may have a cavity present therein matching the profile of the knife structure 100. The cap portion 53 may be employed to enclose the metal work piece 10 within the body portion 52, as depicted in FIG. 6B. In this manner the portions of the knife structure 100 that have been plated with the thermally conductive plating 104 are entirely covered by the body portion 52, i.e., fixture, and cap portion 53, of the assembly including the boron containing solid form 50. In some embodiments, the body portion 52, i.e., fixture, and cap portion 53 of the assembly protect the thermally conductive plating 104 from oxidation during the thermochemical diffusion treatments that are applied to the apex region 200 of the knife structure 100 in steps 140, 145, 150 and 155 of the process flow that is depicted in FIG. 5. In some embodiments, the thermally conductive plating 104 can be entirely protected from oxidation by the body portion 52, i.e., fixture, and cap portion 53 of the assembly. The body portion 52 and the cap portion 53 may each be composed of refractory material, such as graphite (C), silicon carbide (SiC), aluminum oxide ($Al_2O_3$), silicon dioxide ($SiO_2$), zirconium dioxide ($ZrO_2$), magnesium oxide (MgO), and combinations thereof.

Still referring to FIGS. 6A-6F, the sidewalls of the assembly that are provided by a boride containing solid form 50 acts a boron source during the later described thermochemical diffusion treatments in steps 145, 150 and 155 of the process flow that is depicted in FIG. 5. The boride containing solid form 50 is a solid form having a porosity, typically being an open cell porosity. The term "solid form having a porosity" denotes a structure including a unitary solid matrix of a boron containing material, wherein an open cell porosity is dispersed throughout the unitary solid matrix of the boron containing material. By "boron containing" it is meant that the solid form has a boron concentration of at least 50 wt. %. In one embodiment, the boron concentration of the boron containing solid form 50 is at least 70 wt. %. In yet another embodiment, the boron containing solid form 50 has a boron concentration ranging from 75 wt. % to 95 wt. %. In yet a further embodiment, the boron containing solid form 50 has a boron concentration ranging from 80 wt. % to 90 wt. %. It is noted that the concentration of boron in the boron containing solid form 50 may be any value within the aforementioned ranges. For example, the concentration of boron in the boron containing solid form 50 may be 50 wt. %, 60 wt. %, 70 wt. %, 80 wt. %, 90 wt. % or 100 wt. %. In some embodiments, the above concentrations are typical of boron carbide. In other embodiments, when in the boron containing material is in form of "Ferro Boron", the boron content may be as low as 18%, which may be due to the density of the component materials. Ferro Boron may be employed in thin films and small areas where boron concentrations may be consumed without depletion. A possible additional boron source is amorphous boron and or crystalline boron.

In some embodiments, the boron containing solid form 50 may be composed of boron carbide. The boron carbide may be $B_4C$, but the present disclosure is not limited to only this composition of boron carbide, as the boron carbide may have the composition $B_nC$, wherein "n" may range from 4 to 10. In one example, when the boron carbide is $B_4C$, the boron content may be equal to 78 wt. % or greater. In another example, when the boron carbide is $B_{6.5}C$, the boron content may be equal to 85 wt. % or greater. Boron carbides are also known with carbon concentrations ranging from 8.8 to 20 atom %. $B_4C$ ($B_{12}C_3$) has a crystal structure of B11C icosahedra with C-α-C intericosahedral chains. Also included is the isolation of isotopes of boron. For example, elemental boron (B) has a boron makeup of 80% isotope $^{11}B$ and 20% $^{10}B$. However, in applications where the boron is used as a neutron absorber (radioactive applications) the isotope $^{10}B$ is isolated and can be used in 100% concentration. In addition to boron carbide, the boron containing solid form 50 may also be ferro boron, amorphous boron, and possibly other boron containing compounds.

In one example, the composition of the boron containing solid form 50 includes a combined boron and carbon (B+C) content ranging from 93 wt. % to 99 wt. %, a boron oxide ($B_2O_3$) content of 1.0 wt. % or less, an iron (Fe) content of less than 0.5 wt. % and a silicon (Si) content of less than 0.5 wt. %. In another example, the composition of the boron containing solid form 50 includes a combined boron and carbon (B+C) concentration ranging from 94 wt. % to 98.5 wt. %, in which the minimum boron content may range from 74 wt. % to 79 wt. % and the maximum carbon content may range from 17 wt. % to 24 wt. %. In this example, boron oxide ($B_2O_3$) may be present in an amount ranging from 0.1 wt. % to 1.0 wt. %, iron (Fe) may be present in an amount ranging from 0.2 wt. % to 0.5 wt. %, and silicon (Si) may be present in an amount ranging from 0.1 wt. % to 0.3 wt. %.

In some embodiments, boron carbide ($B_4C$) that is suitable for use with the methods and structures disclose herein may be produced by the high temperature, e.g., about ~1370° C. to ~2485° C., interaction of boric oxide ($B_2O_3$) and carbon (C) and/or magnesium (Mg) in an electrical resistance-type furnace. In the case of carbon (C), the reaction occurs at temperatures above the melting point of boron carbide ($B_4C$) and is accompanied by the production of carbon monoxide (CO), as follows:

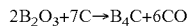

If magnesium is used, the reaction can be carried out in a graphite furnace, and the magnesium byproducts are removed by treatment with acid.

A boron containing solid form 50 composed of boron carbide, e.g., $B_4C$, can be fabricated by hot pressing, sintering, and sinter-HIPing (HIP=hot isostatic press). Industrially, densification is carried out by hot pressing (3813° F. (2100° C.) to 3992° F. (2200° C.), 20 MPa to 40 MPa) in argon. Pressureless sintering may be employed with additives, such as carbon (C). In some embodiments, the boron containing solid form 50 may be manufactured from a sintering method at a temperature that is selected so that the boron containing solid form 50 has a density that is no greater than 60%.

In some embodiments, a porogen material may be included into the chemical pack used in forming the boron containing solid form 50. The porogen material can provide an open cell porosity to the boron containing solid form 50. The porogen material may be an outgassing material. In one example, the chemical pack typically includes a majority of boron (B) and carbon (C), iron (Fe) and silicon (Si). The porogen material may thermally decompose, or react with the chemical pack during the formation of the open cell porosity of the boron containing solid form 50. Examples of porogen materials include carbon black, potassium borofluoride ($KBF_4$), chromic acid, thorium oxide, cerium oxide, and combinations thereof. The porogen may be present within the chemical pack that is used in forming the boron containing solid form 50 in an amount ranging from 0.5 wt. % to 25 wt. %. In another embodiment, the porogen may be present within the chemical pack that is used in forming the boron containing solid form 50 in an amount ranging from 3 wt. % to 10 wt. %.

In some embodiments, the boron containing solid form 50 may have an open porosity. As used herein, the term "open porosity" denotes pores that are open to the exterior of the structure containing the pores, e.g., the boron containing solid form 50, wherein gasses can flow through them. In some embodiments, the open porosity of the boron containing solid form 50 provides passages from one side of the boron containing solid form 50 to another side of the boron containing solid form 50, which allows for a gas, such as halide containing gas, to be passed through the boron containing solid form 50 for treating the surface of the metal work piece 10. In one embodiment, the porosity of the boron containing solid form 50 is equal to 10% or greater of the boron containing solid form 50 by volume. In another embodiment, the porosity of the boron containing solid form 50 ranges from 10% to 90% by volume. In another embodiment, the porosity of the boron containing solid form 50 may range from 20% to 80% by volume. In yet another embodiment, the porosity of the boron containing solid form 50 may range from 30% to 70% by volume. In one example, the porosity of the boron containing solid form 50 is 40%.

Figure 6F:
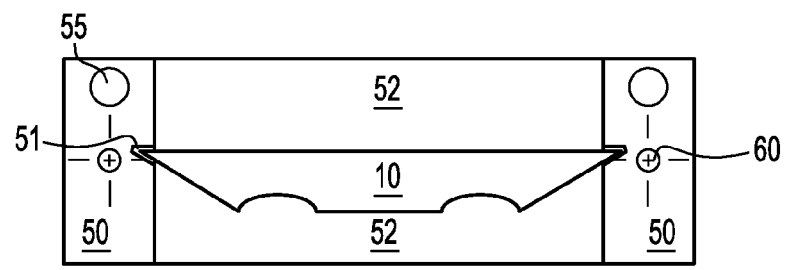
FIG. 6F is a cross-sectional view along section line F-F of the boron containing solid form that is depicted in FIG. 6A, wherein the boron containing solid form is housing a knife structure.
Figure 7:
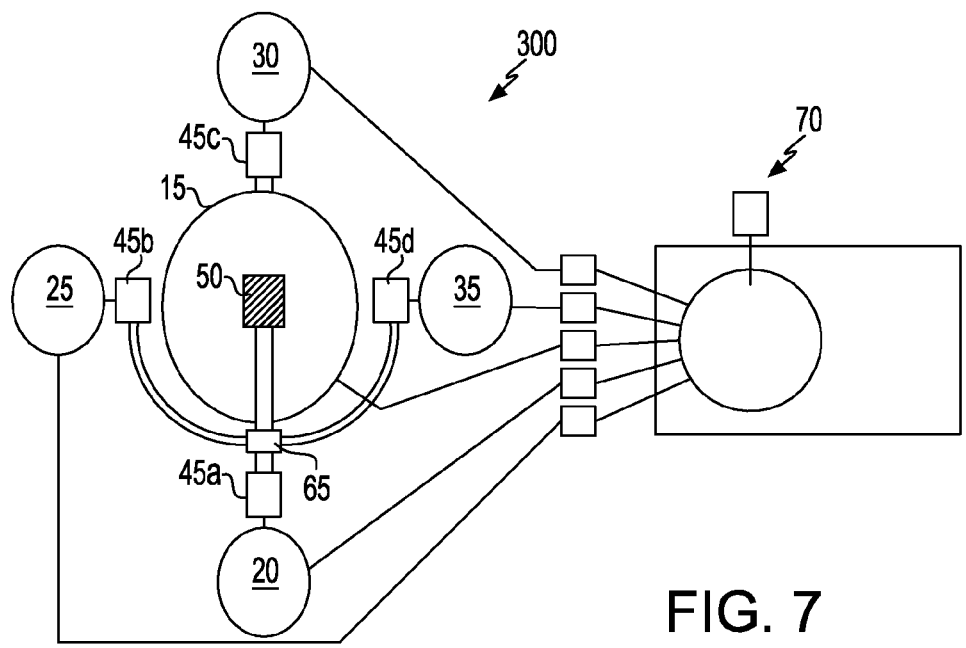
FIG. 7 is a side pictorial view of one embodiment of a boriding apparatus for the multi-component boriding treatment used in accordance with the process flow described in FIG. 5, in accordance with one embodiment of the present disclosure.
Figure 8:
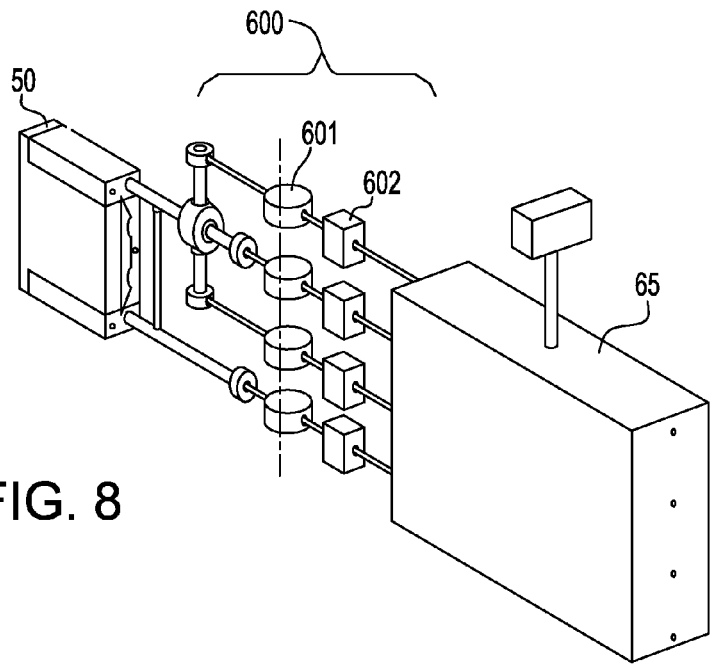
FIG. 8 is a perspective view of the connectivity of the gas passages in the boron containing solid form to the manifold of the multi-component boriding apparatus, in accordance with one embodiment of the present disclosure.

At step 130 of the process flow depicted in FIG. 5, the fixture, i.e., body portion 52, containing the knife structure 100 is positioned within an assembly including the boron containing solid form 50 so that the apex region 200 of the knife structure 100 is adjacent to the boron containing solid form 50. In one embodiment, the fixture, i.e., body portion 52, is assembled with the cap portion 53, and the boron containing solid form 50 to provide the assembly housing the knife structure 100. In the assembly that is depicted in FIGS. 6A-6F, the boron containing solid form 50 provides the sidewall elements of the assembly, and includes a treatment region 51, e.g., notch or cavity. Referring to FIG. 6F, the treatment region 51 provides that the boron containing solid form 50 be positioned adjacent to the apex region 200 of the knife structure 100, but does not contact the knife structure 100. The treatment region 51 of the boron containing solid form 50 is typically in communication with a gas passageway 60 so that a halide containing gas that is supplied to the reactor chamber 15 reacts with the boron containing solid form 50 to provide a gas that borides the metal work piece 10. In one example, communication between the gas passageway 60 and the metal work piece 10 is provided by the open cell porosity of the portion of the boron containing solid form 50 that is present between the treatment region 51 and the gas passageway 60. The gas passageway 60 is in communication with the manifold 65 of the multi-component bonding apparatus 500 that is depicted in FIGS. 7 and 8. In some embodiments, the treatment region 51 of the boron containing solid form 50 can be configured to provide for a localized treatment of only a specified portion of the metal work piece 10. For example, in the embodiment that is depicted in FIGS. 6A-6F, the treatment region 51 of the boron containing solid form 50 may be configured to have a geometry that minors the geometry of the tip of that knife structure 100 that provides the apex region 200. In this embodiment, the treatment region 51 of the boron containing solid form 50 may be a notch in the sidewall of the boron containing solid form 50.

In some embodiments, the body portion 52, the cap portion 53 and the sidewall elements that are provided by the boron containing form 50 for the assembly containing the knife structure 100 may be connected by a series of dowel pins 54. The dowel pins 54 can be formed of a refractory material similar to the refractory material used for the body portion 52 and the cap portion 53. The dowel pins 54 can also be composed of a metal. Mounting openings 55 are also present through the cap portion 53 and the sidewall elements of the assembly that are provided by the boron containing form 50. In some embodiments, the mounting openings 55 allow for a plurality of assemblies of the boron containing form 50, cap portion 53 and body portion 52, which each house a metal work piece 10, to be stacked upon one another within the reactor chamber 15 of the multi-component bonding apparatus 500 that is depicted in FIG. 7. This can provide for multiple knife structures 100 to be treated within the reactor chamber 15 simultaneously.

At step 135 of the process flow depicted in FIG. 5, the assembly of the knife structure 100, the fixture, i.e., body portion 52, and the boron containing solid form 50 are positioned within the reaction chamber 15 of the multi-component bonding apparatus 500 that is depicted in FIG. 7. Reference number 50 in FIG. 7 is depicting a boron containing solid form as part of an assembly housing the knife structure 100, as depicted in FIGS. 6A-6F. It is noted that a single assembly housing a single metal work piece 10 may be positioned within the reactor chamber 15 of the bonding apparatus 100, or a multiple assemblies each including a single metal work piece 10 may be positioned within the reactor chamber 15 of the boriding apparatus 100 so that multiple metal work pieces 10 may be treated within the reactor chamber 15 simultaneously. In some embodiments, when multiple metal work pieces 10 are being simultaneously treated within the reactor chamber 15, the multiple assemblies may be stacked on a rack, wherein alignment between the stacked assemblies is provided by the mounting openings 55 that extend through the cap portion 53 of the assembly and the sidewall elements of the assembly that are provided by the boron containing solid form 50.

In some embodiments, each of the assemblies including the boron containing solid form 50 may be connected through a gas line to the manifold 65 of the boriding apparatus 100 so that the halide containing gas, e.g., boron trifluoride ($BF_3$), can be directly injected to the each of the boron containing solid forms 50. In another embodiment, a gas line 600 from the manifold 65 may be in direct contact with the boron containing solid form 50 of one assembly, as depicted in FIG. 8, in which communication between the adjacent assemblies is provided by a passageway extending through the boron containing solid form 50 from one face of the form to an opposing face of the form. In some embodiments, the gas line 600 may include a plurality of solenoids 601 and valves 602. More specifically, the passageway through the boron containing solid form 50 is aligned to the passageway through the adjacent boron containing solid forms 50. In this manner, a continuous passageway is provided from the gas line contact to the first boron containing solid form 50 and through the adjacent boron containing solid forms 50.

Although the reactor chamber 15 is depicted as having a circular geometry, the reactor chamber 15 is not limited to only the geometry that is depicted in FIG. 7. The reactor chamber 15 may have any geometry that can contain the boron containing solid form 50 and the knife structure 100. For example, the reactor chamber 15 may be multi-sided, such as rectangular, or the reactor chamber 15 may be cylindrical. The reactor chamber 15 may have walls composed of a metal, such as stainless steel. The reactor chamber 15 may also have walls that are composed of a glass, ceramics, mica, high temperature composites (metal, polymer, ceramic, clay/mineral) or a combination thereof. The reactor chamber 15 may also include a number of openings, in which each opening is connected to a reaction gas production chamber 20, 25, 30, 35 through a manifold 65 and a plurality of valve assemblies 45a, 45b, 45c, 45d. In some embodiment, a heating element may be integrated with the reactor chamber 15. For example, the heating element may be the boron containing solid form 50.

In the embodiments, in which the boron containing solid form 50 provides a heating element, the boron containing solid form 50 converts electricity into heat through the process of joule heating. More specifically, to provide a heating element for the reactor chamber 15 of the multi-component boriding apparatus 500, electrical current is passed through the boron containing solid form 50. The electrical current that is passed through the boron containing solid form 50 encounters resistance, resulting in heating of the element. In some embodiments, the boron containing solid form 50 is porous and does not conduct electricity well at low temperature. However, once we are at reaction temperature, the conductivity of the boron carbide form 50 is greatly improved. Because the energy source (heat) is localized to the knife structure 100, the use of the boron carbide form 50 as a heating element may increase the efficiency of the treatment. In the embodiments, in which the boron containing solid form 50 provides a heating element, the porosity of the boron containing solid form 50 is greater than 10%, and in some examples may be on the order of 40%.

In other examples, another heating element may be used in combination with the boron containing heating element 50, such as convection heater, a heat lamp, a conductive heater, a microwave heater, a resistive heater, inductive, RF, chemical reaction heater (CRH) or a combination thereof. In yet another example, the boron containing solid form 50 does not function as a heating element, and the temperature of the reactor chamber 15 is controlled by at least one of a convection heater, a heat lamp, a conductive heater, a microwave heater, inductive heater, radio frequency heater, chemical reaction heater, and a resistive heater.

Still referring to FIG. 7, in some embodiments, the multi-component boriding apparatus 500 further includes at least one treatment gas producing chamber 20, 25, 30, 35 that in communication with the reactor chamber 15 through a manifold 65. The at least one treatment gas producing chamber 20, 25, 30, 35 provides a gas used in the treatment of the metal work piece 10 by the boriding apparatus 100. Although FIG. 7 depicts four treatment gas producing chambers 20, 25, 30, 35, the present disclosure is not limited to only this embodiment. Any number of treatment gas producing chambers 20, 25, 30, 35 have been contemplated for use with the multi-component boriding apparatus 500 disclosed herein.

In some embodiments, at least one of the treatment gas producing chambers 20, 25, 30, may be a furnace. In some embodiments, the heating element of the furnace for each of the treatment gas producing chambers 20, 25, 30, 35 may be a convection heater, a heat lamp, a conductive heater, a microwave heater, a resistive heater, inductive heater, radio frequency heater (dipole rotation), chemical reaction heater, or a combination thereof. In some examples, the heating element may be a resistance wire, bar, tube, or ribbon composed of kathal (FeCrAl), nichrome 80/20, copper nickel alloys, silicon carbide, graphite & carbon composites, molybdenum disilicide ($MoSi_2$) and molybdenum disilicide doped with aluminum (Al). The heating element may also be composed of positive thermal coefficient of resistance (PTCR) ceramics, such as barium titanate and lead titanate composites. As for the chemical reaction heater, chemical reactions that are exothermic (thermite, ALICE aluminum ice) and are contained in a suitable designed reactor in which the chemicals come together, react producing heat, this heat is stored in well insulated radiant tubes and blended with applicable volumes of air and circulated around the retort to be heated.

Each of the treatment gas producing chambers 20, 25, 30, 35 may be in communication to the reactor chamber 15 though a manifold 65 and a valve assembly 45a, 45b, 45c, 45d. More specifically, the manifold 65 includes a gas line into the boron containing solid form 50. In some embodiments, a valve controlled manifold is present between the manifold 65 and the boron containing solid form 50. The valve of the valve controlled manifold may be micro or needle valve. In some embodiments, the valve controlled manifold may direct a potential gas flow through the gap or cavity that is present between the boron containing solid form 50 and the metal work piece 10, without requiring that the potential gas flow be filtered through the porosity of the boron containing solid form 50. This can be helpful in some applications where a post boron (B) layer needs to be deposited without possibly contaminating the boron source, filling the porosity, and/or controlling concentration levels by flowing an inert gas into the reacted gas before it comes in contact with the target part.

A gas line also extends from each of the valve assemblies 45a, 45b, 45c, 45d to the manifold 65. Each of the valve assemblies 45a, 45b, 45c, 45d can provide an open and closed position to each of the respective treatment gas producing chambers 20, 25, 30, 35. When the valve assembly 45a, 45b, 45c, 45d is open, the at least one treatment gas producing chamber 20, 25, 30, 35 is in communication with the boron containing solid form 50 within the reactor chamber 15 through the manifold 65. The valve assemblies 45a, 45b, 45c, 45d can also provide a partially open or partially closed position to regulate the flow of gas or combine different concentrations coming from different gas producing chambers at different times during the formation of composite layers. By "in communication" it is meant that gasses from the at least one treatment gas producing chamber 20, 25, 30, 35 can be transported to the boron containing solid form 50 that is present in the reactor chamber 15. When the valve assembly 45a, 45b, 45c, 45d is closed, the at least one treatment gas producing chamber 20, 25, 30, 35 is separated from the reactor chamber 15. By "separated from" it is meant that gasses from the at least one treatment gas producing chamber 20, 25, 30, 35 can not move, i.e., be transported to, the reactor chamber 15.

The multi-component boriding apparatus 500 may further include a vacuum pump assembly 70 that may be connected to each of the treatment gas producing chambers 20, 25, 30, 35, and the reactor chamber 15. The vacuum pump assembly 70 can dictate the pressure for each of the treatment gas producing chambers 20, 25, 30, 35, and the reactor chamber 15. Air and moisture is removed by pumping down the reactor chamber 15, the treatment gas producing chambers 20, 25, 30, 35, and the associated plumbing, which vacates the voids, i.e., porosity, in the boron containing solid form 50 and the treatment region 51 of the boron containing solid form 50. Thereafter, the system including the reactor chamber 15 is backfilled with argon (Ar), hydrogen (H), argon/hydrogen (Ar)/(H), or helium (He) gas.

In some embodiments, the multi-component boriding apparatus 500 can provide for independent control of the temperature in the reactor chamber 15 that is containing the knife structure 100 that is to be borided, and independent control of the temperature of each of the treatment gas producing chambers 20, 25, 30, 35. It has been determined that the temperature of the components of the multi-component boriding apparatus 500, such as the reactor chamber 15 and the treatment gas producing chambers 20, 25, 30, 35, can have a dynamic effect on the boriding treatments. Temperature can affect the chemical mechanical energy of the boriding elements, i.e., the frequency and force that the atoms, e.g., boron (B), strike each other.

Too high a temperature increases the speed at which the atoms move, which can make bonding of the boriding elements to the apex region 200 of the knife structure 100 being treated difficult. For example, temperature is believed to dictate the frequencey that new atoms, e.g., iron (Fe), boron (B), are available to replace the already reacted atoms, i.e., $Fe_2B$ and FeB, in boriding thermochemical diffusion treatments. In some embodiments, the desired composition for boriding is the iron-II-boride phase, because of its greater ductility and the difference of thermal expansion rates between the two layers of iron boride (FeB) and iron-II-boride ($Fe_2B$) creates stresses that can result in spalling and delamination. In some embodiments, it is an objective of the methods and structures disclosed herein to maintain a boron concentration of not less than 8.5% and not greater than 15.8% to form the iron-II-boride ($Fe_2B$) phase. Temperature can influence boron concentration. The temperature can affect concentations levels. For example, if the temperature of the metal work piece 10 is too hot, the boron concentration can drop below 8.5%. In another example, if the temperature of the metal work piece 10 is to cold, the boron concentration can exceed 16%.

Because of temperature, the speed in which the grain structure changes due to internal equilibrium can influence the rate and the structure of the growing nucleating cell. Temperature also affects the chemical reactions in decomposition, as well as the chemical concentrations throughout the system. For example, the temperature effects the decomposition of potasium borofluorate ($KBF_4$), which results in the formation of boron trifluoride ($BF_3$) for reaction with boron carbide ($B_4C$) to provide a boriding gas, such as boron difluoride ($BF_2$). The temperature can also moderate a reaction's energy flow effecting reaction equilibrium. The movement of the reactant gas to the growth of the nucleated crystal, follows the lattice or grain boundary, and may depend on orientation of the crystal planes and the resistance of the static and kinetic forces at the operating temperature of each of the element making up the alloy of the apex region 200 of the knife structure 100 being borided. In the initial deposit and migration of the newly formed seeds of iron boride (FeB) and iron-II-boride ($Fe_2B$), the grain orientation has a low angle grain boundary, the seeds of nucleation along with defects associated with stress-strain mechanics influence dislocations, which in this dynamic system result in misorientation. Because of the physical properties of the nucleated iron boride (FeB), first and subsequent iron-II-boride ($Fe_2B$) phases, in relationship to the parent metal part, the high elastic limit of the iron boride (FeB) reduces the number of dislocations being formed by the bending of the lattice. As these grains continue to grow, the energy along the boundary accumulates until the force of flow of the diffusion atoms are greater than the static forces of developing grains. This causes the grain to shift or reorient itself so that the boundary is prependicular to the surface. A boundary moves due to pressure acting on it. It is generally assumed that the velocity is directly proportional to the pressure with the constant of proportionality being the mobility of the boundary. The mobility is strongly temperature dependent and often follows an Arrhenius type relationship:

$M=M_o \exp(-Q/RT)$ Linear kinetic equation

M=Mobility
$M_o$=Boundary being curved
Q=Energy Barrier or Activation Energy
R=Reaction Rate
T=) Reaction Rate On the two sides of the boundary are reaction rates of the materials separated by the boundary, The R and T designations represent reaction rates these two different crystalline systems.

For example, as temperature increases for boriding operations within the range of 1470° F. (~800° C.) to 1877° F. (~1025° C.), the concentration of boron difluoride ($BF_2$) may increase (primary reactant with 2Fe iron in forming $Fe_2B$) from a reaction of $BF_3$ and $B_4C$ ($BF_3$ reacts with boron carbide producing $BF_2$) according to the reaction equation:

$$8BF_3 + B4C \rightarrow 12BF_2 + C$$

It is further believed that if an accumulation of boron (B) on the surface of the knife structure 100 during boriding is too rapid, a "black layer" is created, which when analyzed shows a chemistry high in amorphous boron. A black layer may also be obtained when contaimates of oxygen are present in the system, which can result in the formation of a boron oxide ($B_2O_3$) layer. The presence of a black layer on the knife structure 100 can obstruct boriding.

Figure 9:
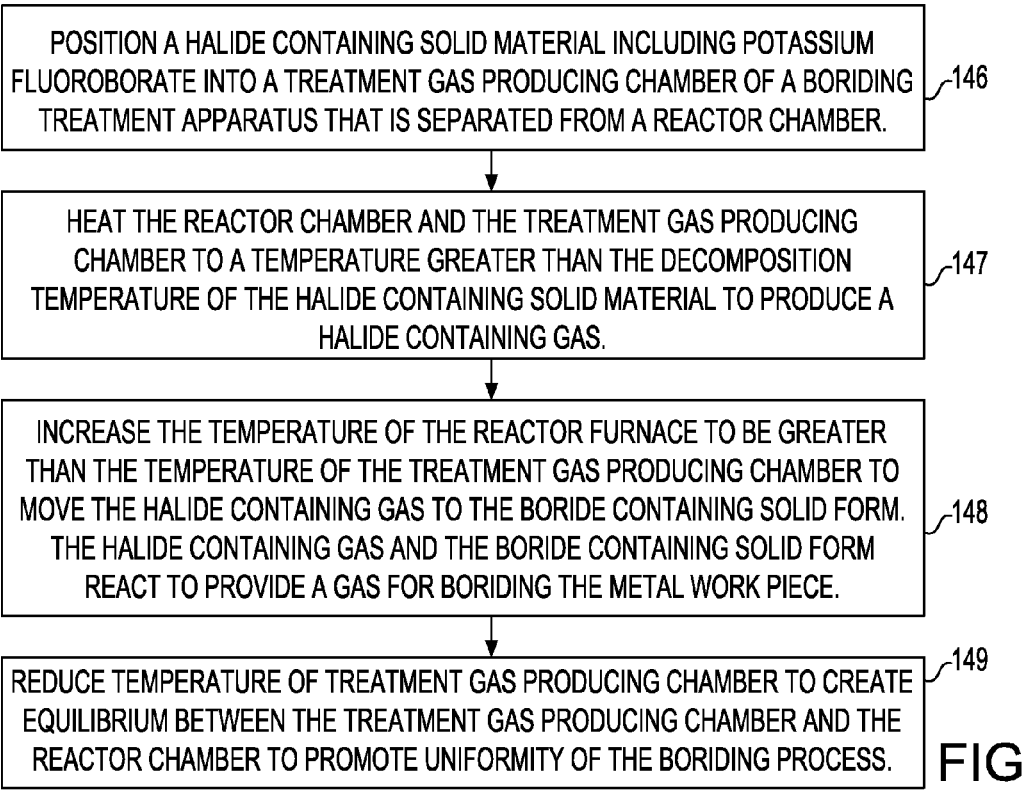
FIG. 9 is a flow chart depicting one embodiment of the process flow for the boriding step described in flow chart described in FIG. 5.

As will be further described in the process flow depicted in FIGS. 5 and 9, the multi-component boriding apparatus 500 that is depicted in FIG. 7 can independent control the temperture of the reactor chamber 15 and the temperature of the first treatment gas producing chamber 20, second treatment gas producing chamber 25, third treatment gas producing chamber 30 and fourth treatment gas producing chamber 35. Therefore, in some embodiments, by isolating and controlling not only the temperture of the knife structure 100, but seperately controlling the temperature of the boriding gasses, and when the boriding gasses are available to the apex region 200 of the knife structure 100, the multi-component boriding apparatus 500 and process flow provided herein can control a boriding process in a manner that has not been previously been provided. For example, the multi-component boriding apparatus 500 that is depicted in FIG. 9 can emulate the boriding conditions, e.g., temperature of the work piece and concentration of boron provided by the boriding agent, of a boriding pack process without requiring that the knife structure 100 be subjected to direct contact with the boriding agent. In this manner a boriding process is provided that does not result in a boriding agent, such as a boron containing frit or powder, being engaged to the surface of the knife structure 100 in a manner that requires cleaning steps for removal.

Further, by isolating and controlling the temperature of the reactor chamber 15 and the second treatment gas producing chamber 20 independently, the multi-component boriding apparatus 500 allows for control of the movement of gasses formed in the second treatment gas producing chamber 20 between the second treatment gas producing chamber 20 and the reactor chamber 15. For example, when the boriding gas has a higher temperature than the temperature of the metal work piece 10, the boriding gas may condense on the metal work piece 10 providing a higher concentration of boron at the surface of the metal work piece 10. When the temperature of the metal work piece 10 and the temperature of the boriding gas are the same, the concentrations may be balanced. When the temperature of the knife structure 100 is higher than the temperature of the boriding gas, the concentrations of boron at the surface of the knife structure 100 will decrease.

In some embodiments, control of the temperature of the knife structure 100, and control of the temperature of the boron containing solid form 50 that provides the reaction site for forming the boriding gas, is provided by the boron containing solid form 50 that functions as a heating element. As depicted in FIGS. 6A-6F, when the boron containing solid form 50 is the heating element for the reactor chamber 15, the close proximity of the boron containing solid form 50 to the knife structure 100 allows for the temperature of the knife structure 100 to be precisely controlled.

To assure the proper temperature of the reactant gasses, i.e., boron trifluoride ($BF_3$) and boron difluoride ($BF_2$), the multi-component boriding apparatus 500 can monitor the reactant gas chemical composition and concentrations at both the reactant site, i.e., apex region 200 of the knife structure 100 and/or boron containing solid form 50, as well as where it is being created and transported. Using real time monitoring of the reactant gasses allows for computer programming to maximize efficiencies and control each batch to a predetermined quality standard. This can be achieved using a Hiden Analytical real time gas analyzer, such as a Hiden HPR-20 QIC quadpole spectrometer, for multiple species gas and vapor analysis.

The multi-component boriding apparatus 500 is a system that can provide a balanced state during the boriding operation, because of the temperature controlled furnace operations. Due to the enthalpy of reaction taking place between the boron trifluoride ($BF_3$) and the boron containing solid form 50 of boron carbide ($B_4C$), the newly created boron difluoride ($BF_2$) has additional energy (heat) in a micro system. The second law of thermodynamics indicates, entropy, matter goes from a higher order to a lower order, i.e., higher heat to lower heat. In the system, the reactant gas is believed to be thermally conducted. The boron trifluoride ($BF_3$) from the decomposed potassium fluoroborate ($KBF_4$) (potassium fluoroborate ($KBF_4$) thermally decomposed to produce potassium fluoride (KF) and the more reactive boron trifluoride ($BF_3$)) condenses on the steel (Fe) surface of the metal work piece 10. In some embodiments, a reaction between the iron (Fe) and the boron trifluoride ($BF_3$) produces a surface layer of iron fluoride ($FeF_3$), wherein the boron in the form of amorphous boron (B) reacts with the iron fluoride $FeF_3$ surface creating a monomolecular p-solid state layer initiated on surface inclusions of iron boride (FeB). Additionally, the decomposition of potassium fluoroborate ($KBF_4$) into boron trifluoride ($BF_3$) and potassium fluoride (KF) provides the catalysis or precursor for reaction with the boron containing solid form 50 of boron carbide ($B_4C$) to provide a boriding gas of boron difluoride ($BF_2$). The reaction between the boron trifluoride ($BF_3$) and the boron carbide ($B_4C$) of the boron containing solid form to provide a boriding gas of boron difluoride ($BF_2$) is as follows:

$$BF_3 + B_4C \rightarrow 12BF_2 + C$$

In some embodiments, boron difluoride ($BF_2$) plays a major role in boriding the apex region 200 of the knife structure, i.e., forming borides in the apex region 200. The following reactions are representative of boride formation in an iron (Fe) containing knife structure 100 treated with a boriding gas of boron difluoride (BF$_2$):

$$3BF_2 + 2Fe \rightarrow Fe_2B + 2BF_3, \text{ and}$$

$$3BF_2 + Fe \rightarrow FeB + 2BF_3$$

This provides the continued boron trifluoride (BF$_3$) to react with the boron carbide, e.g., B$_4$C, of the boron containing solid form 50 at the point of reaction, as the above equations illustrate. This is additional to the boron trifluoride (BF$_3$) from the decomposition of fluoroborate (KBF$_4$). Initial boriding of the apex region 200 of the knife structure 100 can be referred to as a solid phase epitaxy stage, which is a transition between the amorphous and crystalline phases of a material. The continuing reaction between the boron difluoride (BF$_2$) and the elements of the steel may be impeded by the initial single layer of iron boride (FeB). In view of the initial iron boride (FeB) layer, the reaction is slowed adequately with iron (Fe) so that the rate of diffusion facilitates a 2 parts iron (Fe) to 1 part boron (B) ratio, i.e., iron-II-boride (Fe$_2$B). In some applications, the 2 parts to 1 part ratio of iron (Fe) to boron (B) is at the surface of the metal work piece 10, and may be desirable because iron-II-boride (Fe$_2$B) is more ductile than iron boride (FeB). Further, the thermal expansion between the two different phases of iron boride (FeB) and iron-II-boride (Fe2B) is high, which can create a difference in the expansion and contraction between the two layers of different boride composition, which can build up stored energy in the form of stress.

The available boron (B) for diffusion into the knife structure 100 that is provided by the methods and structures of the present disclosure may be in a concentration of 5 wt. % to 20 wt. % by molar mass. In another embodiment, the boron (B) diffused into the knife structure 100 may be in a concentration ranging from 8 wt. % to 18 wt. %. In yet another embodiment, the boron (B) that is diffused into the knife structure 100 may be in a concentration ranging from 9 wt. % to 16 wt. %. When the concentration of the boron diffused in the iron (Fe) containing knife structure 100 ranges from 8.83 wt. % and 16.23 wt. %, the boride being formed in the metal work piece may be iron-II-boride (Fe$_2$B). When the concentration of the boron diffused in the iron (Fe) containing metal work piece 10 is greater than 16.23 wt. %, the boride being formed in the knife structure 100 may be iron boride (FeB).

In some embodiments, the boriding process provided by the boriding apparatus depicted in FIG. 7, and the process flow illustrated in FIGS. 5 and 9, may provide a single layer of iron-II-boride (Fe$_2$B), and a singular molecular layer (or other small amount) of iron boride (FeB) in the apex region 200 of the metal knife structure 100. For example, the single layer of iron-II-boride (Fe$_2$B) may have a thickness ranging from 2 microns to 500 microns, and the thickness of the singular crystalline layer of iron boride (FeB) may range from 280 Å to 480 Å. The single molecular layer of iron boride (FeB) can be acceptable, because of the small effect of such a small layer. The details of the thermochemical diffusion processes, such as boriding, of the present disclosure are now discussed in greater detail.

Following loading of the knife structures 100 into the multi-component boriding apparatus 500, a vacuum, e.g., ranging from 10$^{-3}$ torr to 10$^{40}$ torr, is created in the reactor chamber 15 to evacuate sufficient oxygen. By evacuating oxygen from the reactor chamber 15, the presence of an oxide layer that could impede the surface treatment is substantially eliminated.

At step 140 of the process flow depicted in FIG. 5, a carburizing gas is applied to the knife structure 100 that is present in the reactor chamber 15. In some examples, the carburizing treatment is applied to the knife structure 100 prior to the boriding treatments. The carburizing treatment may be used as a method to produce a foundation transition zone separating the base metal of the knife structure 100 and the hard diffused layers engineered on the surface of the apex region 200 of the knife structure 100. The carburizing gas is produced in the first gas producing chamber 25 of the multi-component boriding apparatus 500. Carburization of steel involves a heat treatment of the metallic surface using a source of carbon. Carburization can be used to increase the surface hardness of low carbon steel, e.g., steel having a carbon content ranging from 0.1 wt. %-0.99 wt. %. The carbon source may be a gas, such as carbon dioxide (CO$_2$) or methane (CH$_4$). Other carbon sources may include carbon monoxide gas (CO), sodium cyanide and barium chloride, or hardwood charcoal. Other carbon sources may include carbon black, activated carbon, or charcoal in powder form and/or a gas such as acetylene, map, propane, propylene, carbon monoxide, ethylene, methane and combinations thereof. For example, carbon monoxide can break down at the steel surface, as follow:

$$2CO \rightarrow CO_2 + C$$

The liberated carbon is readily dissolved by the austenite phase and diffuses into the body of the steel. One embodiment of carburizing is produced by pulling a vacuum in the reactor chamber 15 in the initial phase, and backfilling the reactor chamber 15 with argon/hydrogen. Following backfilling, the pull down step may reduce the chamber of the reactor chamber 15 to a pressure ranging from 1 Ton to 20 Ton, which is maintained during the carburization step. Carbon can then be delivered to the metal part, i.e., apex region 200 of the knife structure 100, by use of acetylene in the equation:

$$C_2H_2 \rightarrow 2C + H_2$$

Carbon can also be delivered to the knife structure 100 with the use of carbon powder and butyl alcohol that is thermally decomposed in the first gas producing chamber 25 of the multi-component boriding apparatus 500. In some embodiments, the surface carbon potential is greater than 1%. The addition of a metal salt halide to the carbon powder alcohol blend creates a tert-butoxide halide, which may respond well for the use of thermochemical diffusion of carbon in metal. In some examples, the addition of the butyl alcohol will inhibit the accumulation of "soot" in the reaction area. In some embodiments, in which atmospheric carburization is employed, an endothermic atmosphere is created having 40% hydrogen, 40% nitrogen, and 20% carbon monoxide. At carburizing temperature, the addition to the endothermic atmosphere of methane and propane is added to the first treatment gas producing chamber 25 to create a carbon rich boost atmosphere.

The first treatment gas producing chamber 25 containing carbon and alcohol may be heated to a temperature ranging from 1550° F. (8430° C.) to 1724° F. (940° C.), e.g., 860° C. (1580° F.), while the vacuum is being applied to the reactor chamber 15. The reactor chamber 15 may be heated to about 1580° F. (860° C.) for a time period of 15 minutes. In one embodiment, once the reactor chamber 15 is at a vacuum, the reactor chamber 15 may be back filled with an inert gas mixture. In one example, the back filling of the reactor chamber 15 with the inert gas mixture includes argon (Ar) and hydrogen (H) in a ratio of 98% argon and 2% hydrogen, at a flow rate of between 5 standard cu ft/hr and 100 standard cu ft/hr. The partial pressure of the reaction chamber 15 may be at about 1 Torr to 20 Torr for carburizing, and at about atmospheric pressure (about 14.7 psi) for any additional diffusion.

The hot carbon and alcohol gas from the first treatment gas producing chamber 25 may then be allowed to enter the reactor chamber 15. More specifically, the valve 45b separating the first treatment gas producing chamber 25 from the manifold 65 is opened providing a continuous flow path between the first treatment gas producing chamber 25 and the reactor chamber 15. In one embodiment, the reaction period for the hot carbon and alcohol gas may range from 15 minutes to 90 minutes. In another embodiment, the reaction period for the hot carbon and alcohol gas may range from 45 minutes to 75 minutes. In yet another embodiment, the reaction period for the hot carbon and alcohol gas may range from 55 minutes to 65 minutes. In an even further embodiment, the reaction period can be 15 minutes to 30 hours.

Following the carburizing treatment, the reactor chamber 15 may be purged. For example, the reactor chamber 15 may be purged with a flow of argon/hydrogen gas. The flow of the argon/hydrogen gas may be continuous, but it may also be increased, decreased or maintained based on the cycle of the surface treatment. When purging the reactor chamber 15, it may be preferable to increase flow and pressure. In some embodiments, the flow of the argon/hydrogen gas may be selected to dictate the time that a reactive gas, such as a carburizing gasses, is present within the reaction chamber 15, which may be referred to as the reaction period.

For example, once the reactor chamber 15 has held the hot carbon and alcohol gas for the desired time, the valve assembly 45b connecting the first treatment gas producing chamber 25 to the manifold 65 to the reactor chamber 15 may be closed, which stops the flow the hot carbon and alcohol gas from entering the reactor chamber 15. The flow of argon and hydrogen gas may then be increased, e.g., to a rate of 10 standard cu ft/hr, to purge the reactor chamber 15. The time period for purging the reactor chamber 15 with the argon and hydrogen gas may be on the order of 5 minutes.

In some embodiments, after purging of the reactor chamber 15 with the argon and hydrogen mixture, the flow of the argon and hydrogen as mixture can be stopped, and the temperature of the reactor chamber 15 may be raised from to be within the range of about 1616° F. (880° C.) to about 1715° F. (935° C.). In one example, the temperature of the reactor chamber 15 may be raised from to be within the range of 1679° F. (915° C.) to 1715° F. (935° C.).

Following carburizing, a boriding gas may be applied to the knife structure 100 in the reaction chamber 15 from a second gas producing chamber 20 at step 145 of the process flow depicted in FIG. 5. It has been determined that boriding using processes, such as pack boriding, paste boriding, liquid boriding, or fluidized bed boriding, can have a number of disadvantages. For example, the aforementioned boriding processes require cleaning processes following boriding to remove the boriding agent from the surface of the metal work pieces that have been treated. The above boriding processes also have difficulty in controlling the gas compositions at the reaction point. The above noted boriding processes are also labor intensive processes. Boriding by gas boriding or plasma boriding employs poisonous gasses, such as boron trifluoride ($BF_3$) and boron trichloride ($BCl_3$), as the boriding agent. In gas boriding or plasma boriding, the aforementioned poisonous gasses are stored in gaseous form prior to being employed as the boriding agent. Because of the poisonous nature of the boriding agent employed in typical gas boriding and/or plasma boriding, these boriding processes require special safety precautions, such as federal and State regulations of handling hazardous materials and the reporting thereof. Specialized equipment for the containment and isolation of poisonous and or potentially explosive materials. Redundant and expensive monitoring and dynamic equipment required to maintain a safe work environment and to the surrounding community.

In one embodiment, the methods and structures disclosed herein can overcome the aforementioned difficulties by employing at least one of a boron containing solid form 50 that is adjacent to, but not in contact with, the apex region 200 of the knife structure 100 being borided; and by employing a halide containing gas that is formed within the multi-component boriding apparatus 500 from a non-poisonous halide containing solid material. In some embodiments, the halide containing gas is formed by thermally decomposing a halide containing solid material in the second treatment gas chamber 20 that is separated from the reactor chamber 15 of the multi-component boriding apparatus 500. The halide containing solid material is not poisonous when in solid form. For example, the halide containing solid material may be potassium fluoroborate ($KBF_4$). Therefore, the halide containing solid material eliminates the requirement of storing poisonous, such as boron trifluoride ($BF_3$). In this example, the halide containing gas, e.g., boron trifluoride ($BF_3$), which is formed in the second treatment gas production chamber 20, is passed through the gas passageway 60 to the treatment region 51. When the halide containing gas passes from the gas passageway 60 through the open cell structure of the boron containing solid form 50 to the treatment region 51, the halide containing gas reacts with the boron containing solid form 50 to provide the gas that treats, e.g., borides, the apex region 200 of the knife structure 100. More specifically, in one example, a halide containing gas of boron trifluoride ($BF_3$) reacts with the boron carbide ($B_4C$) of the boron containing solid form 50 to produce boron difluoride ($BF_2$) and boron fluoride (BF) as the gas that treats, i.e., borides, the knife structure. Some examples of reactions by which iron borides are formed in a metal work piece include:

$$3BF_2 + 2Fe \rightarrow Fe2B + 2BF_3$$

$$3BF_2 + Fe \rightarrow FeB + 2BF_3$$

In some examples, boron monofluoride (BF) reactions of the disclosed boronizing process are as follows:

$$BF_3(g) + BF(g) = 2BF_2(g)$$

The treatment region 51 of the boron containing solid form 50 can be configured to provide for a localized treatment of only a specified portion of the knife structure 100. From this one may conclude that it is the boron difluoride ($BF_2$) or the boron fluoride (BF), which is diffused into the apex region 200 of the knife structure 100. The free fluorine (Fl), which was bonded with the boron (B) in $BF_2$ or BF, react and result in a reconstituted boron trifluoride ($BF_3$), which in turn is available to re-react with the surface boron carbide 50 to begin the cycle again.

The boron containing solid form 50 may be positioned in close proximity to, but separated from the knife structure 100 that is to be treated by the multi-component boriding apparatus 500. By separating the boron containing solid form 50 from the knife structure 100 that is being treated, the methods and structures disclosed herein ensure that the boronizing agent is not bonded, sintered or otherwise engaged to the surface of the metal work piece 10 that is being boronized. This is distinguished from pack boriding, paste boriding, liquid boriding, or fluidized bed boriding, in which the boronizing agent is in direct contact with the surface being boronized. In pack boriding, paste boriding, liquid boriding, or fluidized bed boriding, because the boronizing agent is in direct contact with the surface being boronized during the high temperature boronizing process, the boronizing agent is typically engaged, bonded or sintered to the surface being treated. The boronizing agent, e.g., boron containing powder, frit or granulate, that is engaged to the boronized surface produced by pack boriding, paste boriding, liquid boriding, or fluidized bed boriding needs to be removed after the boriding process, which adds to the cost of the process and can also effect surface finish. In addition to the benefit of the boronizing media not adhering to the metal of the apex region 200 of the knife structure 100, the void or cavity created between the boron source, i.e., boron containing solid form 50, and the apex region 200 of the knife structure 100 allows for a volume area for the mixing of potential subsequent layers of non-boron chemistries to be incorporated to the composite engineered surface zone.

The distance separating the boron containing solid form 50 from the apex region 200 of the knife structure 100 is also selected to provide for efficient treatment of the knife structure 100 with the gas, e.g., boron difluoride ($BF_2$), that is produced by reacting the halogen containing gas, e.g., boron trifluoride ($BF_3$), with the boron containing solid form 50. It has been found that the reaction rate of boron difluoride ($BF_2$) is so reactive, and in some examples is considered unstable and/or metastable), that in a volume of 1 $mm^3$ many billions of collisions take place. Each collision has the ability to alter the boron subhalide into a more stable state with the molecule it has come in contact with. Thus, as a function of available un-reacted boron difluoride ($BF_2$) and boron monofluoride (BF) in a given distance, as volume increases the available non-reacted boron difluoride ($BF_2$) and boron monofluoride (BF) decreases.

In some examples, the concentration of boron (B) atoms on the surface of the apex region 200 of the knife structure 100 is typically on the order of 9% for a layer of iron-II-boride ($Fe_2B$) to take place, and above 16% for iron boride (FeB). In one example, the boron concentration in boron trifluoride ($BF_3$) is 15.944%. One reason why the boron containing solid form 50 is positioned sufficiently close to the knife structure 100 is that sufficient concentrations of boron difluoride ($BF_2$) and boron monofluoroide (BF) can be required at the apex region 200 of the knife structure 100 for boriding. In some embodiments, the boron containing solid form 50 is separated from the apex region 200 of the knife structure 100 that is being treated by a distance of up to 10 millimeters (mm). In another embodiment, the boron containing solid form 50 is separated from the apex region 200 of the knife structure 100 by a distance of up to 5 mm. In yet another embodiment, the boron containing solid form 50 is separated from the metal work piece 10 by a distance ranging from 1000 microns to 1 mm. In a further embodiment, the boron containing solid form 50 is separated from the metal work piece 10 by a distance ranging from 100 microns to 0.1 mm. In yet another embodiment, the boron containing solid form 50 is separated from the metal work piece 10 by a distance ranging from 30 microns to 100 microns.

In some embodiments of the present disclosure, the boron containing solid form 50 eliminates the incidence of boronizing agent, e.g., boron containing power, frit or boron containing granulates, from being engaged surface being treated, because the boron containing solid form 50 is separated from the apex region 200 of the knife structure 100 being treated. Further, because the boron containing solid form 50 is a unitary structure, instead of a loose powder or discrete granulates, the boronizing agent of the boron containing solid form 50 is not free to disperse from the boron containing solid form 50 and contact the knife structure 100.

In one embodiment, the boriding step of step 145 of the process flow depicted in FIG. 5 may begin with step 146 of the process flow depicted in FIG. 9. Step 146 of the process flow depicted in FIG. 9 includes positioning a halide containing solid material including potassium fluoroborate into the second treatment gas producing chamber 20 of the multi-component boriding apparatus 500 that is separated from the reaction chamber 15. The solid halide containing material may include a metal salts, such as potassium (K), sodium (Na), lithium (Li), magnesium (Mg), calcium (Ca), or compound salts, such as ammonium ($NH_4$), that is combined with at least one of chlorine (Cl), fluorine (F), iodine (I), and astatine (At). In one example of a boriding treatment consistent with the present disclosure, the solid halide containing material may be potassium fluoroborate ($KBF_4$), which can be thermally decomposed to provide a halide containing gas of boron trifluoride ($BF_3$). Potassium fluoroborate ($KBF_4$) can be employed in powder form. In some embodiments, the gas forming solid halide containing material may include potassium fluoroborate ($KBF_4$) in combination with boron carbide ($B_4C$) and graphite (C). In some examples, silicon carbide (SiC) may be substituted for the graphite. In another example, aluminum oxide ($Al_2O_3$) may be substituted for graphite. In some embodiments, the addition of boron carbide ($B_4C$) to the potassium fluoroborate ($KBF_4$) increases the production of boron difluoride ($BF_2$) in the system, which can help to control whether the boriding process is forming iron boride (FeB) or iron-II-boride ($Fe_2B$) in the surface of the metal work piece 10 being treated. The internal tubing in the reactor chamber 15 is composed of boron carbide ($B_4C$), while the external tubing is composed of high nickel chrome stainless steel. This facilitates the production of boron difluoride ($BF_2$) in the system that may in some percentage of concentration convert back to boron trifluoride ($BF_3$) and boron difluoride ($BF_2$).

In one example, the gas forming halide containing solid material may include 100% potassium fluoroborate ($KBF_4$). In another example, a blended compound may be employed including 3% to 75% potassium fluoroborate ($KBF_4$), 10% to 50% boron carbide ($B_4C$), and 5% to 6-% graphite. In another example, the gas forming solid halide material may include 10% to 35% potassium fluoroborate ($KBF_4$), 10% to 40% boron carbide ($B_4C$), and 15% to 55% graphite. In yet another example, the gas forming halide containing solid material may include 7% to 20% potassium fluoroborate ($KBF_4$), 25% to 35% boron carbide ($B_4C$), and 45% to 55% graphite. In some embodiments, the potassium fluoroborate ($KBF_4$), the boron carbide ($B_4C$) and the graphite (C) may be blended in an inert atmosphere, such as argon (Ar).

In the following description, the gas forming solid halide containing material including potassium fluoroborate ($KBF_4$) is positioned within the second treatment gas producing chamber 20, but the present disclosure is not limited to only this scenario. The solid halide containing material may be present in any of the treatment gas forming chambers 20, 25, 30, 35. Further, the third treatment gas producing chamber 30 and the fourth treatment gas producing chamber 35 may be used to produce other reaction gasses to be applied to the metal work piece 10 in combination with the boronizing gasses produced by the second treatment gas producing chamber 20 for multi-component boriding surface treatments including boroaluminizing, borosiliconizing, borochromizing, borovanadizing, borochromvanadizing, borotitanizing, borozirconizing, borohafniuizing, boroniobiumizing, borotanalumizing, boromolybdeniumizing, borotunstenizing, borocobalizing, boronickelizing and combinations thereof, as will be further described below.

The second treatment gas producing chamber 20 is typically separated from the reaction chamber 15 by a closable valve assembly 45a to allow for the solid halide containing material, e.g., potassium fluoroborate (KBF$_4$), to be thermally decomposed into a halide containing gas, e.g., boron trifluoride (BF$_3$), only within the second treatment gas producing chamber 20. Once the halide containing gas is formed within the second treatment gas producing chamber 20, the valve assembly 45a is opened, and the halide containing gas, e.g., boron trifluoride (BF$_3$), is then introduced to the reaction chamber 15 to react with the boron containing solid form 50 to provide the boriding gas, e.g., boron difluoride (BF$_2$). Following treatment, the reaction gasses are removed from the system by a series of exhaust outlets and scrubbers. By decomposing the solid halide containing material in the second treatment gas production chamber 20 to provide the halide containing gas, e.g., boron trifluoride (BF$_3$), the methods and structures disclosed herein can eliminate the requirement of storing a dangerous and/or poisonous gas. Prior methods of gas boronizing and/or plasma boronizing typically employ compressed boron trifluoride (BF$_3$) gas cylinders, which are dangerous and/or poisonous gas. Therefore, in order to run a gas and/or plasma boronizing apparatus, boron trifluoride (BF$_3$) gas has to be stored for use. The methods and structures disclosed herein can eliminate the requirement that boron trifluoride (BF$_3$) gas be stored and employed as the starting gas for the boronizing process. Potassium fluoroborate (KBF$_4$) as used as the starting material for the boriding methods disclosed herein is not a deadly or poisonous gas.

Following the positioning of the assembly including the boron containing solid form 50 and the knife structure 100, within the reactor chamber 15, and following the positioning of the gas forming solid halide containing material, e.g., potassium fluoroborate (KBF$_4$), within the second treatment gas producing chamber 20, the reactor chamber 15 and the second treatment gas producing chamber 20 may be heated at step 147 of the process flow depicted in FIG. 9. The temperature of the first treatment gas producing chamber 20 is heated at step 147 to decompose the gas forming halide containing solid material, e.g., potassium fluoroborate (KBF$_4$). The temperature of the reactor chamber 15 is heated at step 147 to increase the temperature of the boron containing solid form 50, e.g., boron containing solid form 50 composed of boron carbide (B$_4$C), towards a temperature that is suitable for reaction with the halide containing gas, e.g., boron trifluoride (BF$_3$), that is produced by thermally decomposing the solid halide containing material, e.g., potassium fluoroborate (KBF$_4$). The temperature of the reactor chamber 15 is also heated to increase the temperature of the apex region 200 of the knife structure 100 towards a temperature suitable for diffusion of boron (B) from the boriding gas into the surface of the apex region 200. In some embodiments, the surface of the apex region 200 of the knife structure 100 is to be cleaned of any surface oxide before being exposed to the boriding agent, i.e., boron difluoride (BF$_2$). This can be achieved by pulling a vacuum on the reactor chamber 15 using the vacuum assembly 70 that is depicted in FIG. 7. The vacuum applied to the reactor chamber 15 may range from 10$^{-3}$ torr to 10$^{-6}$ torr. Thereafter, the reactor chamber 15 containing the assembly of the boron containing solid form 50 and the knife structure 100 may be filled with argon (Ar) and hydrogen (H) gas, which removes oxides from the surface of the apex region 200 of the knife structure 100.

In one embodiment, at step 147 of the process flow depicted in FIG. 9, the at least the second treatment gas producing chamber 20 is heated to a temperature that is greater than the thermal decomposition temperature of the gas forming solid halide containing material, e.g., potassium fluoroborate (KBF$_4$). Thermally decomposing potassium fluoroborate (KBF$_4$) produces boron trifluoride (BF$_3$) and potassium fluoride (KF) gas, as follows:

$$KBF_4 = BF_3 + KF$$

For example, the thermal decomposition temperature of potassium fluoroborate (KBF$_4$) is about 985° F. to 1058° F. (~530° C. to ~570° C.). Complete decomposition of potassium fluoroborate (KBF$_4$) is at a temperature of about 1292° F. (700° C.). In another embodiment, to thermally decompose potassium fluoroborate (KBF$_4$), the temperature of the second reaction gas production chamber 20 containing the potassium fluoroborate (KBF$_4$) is increased to greater than 1140° F. (~615° C.). Although potassium fluoroborate (KBF$_4$) decomposes at temperatures starting at 985° F., it has been found that in some embodiments, sufficient volumes of boron trifluoride (BF$_3$) for reaction with the boron containing solid form 50, e.g., a boron containing solid form of boron carbide (B$_4$C), are not available until the temperature of the second treatment gas producing chamber 20 is at 1550° F. (850° C.) or greater.

In some embodiments, when the temperature of the second reaction gas producing chamber 20 reaches about 1250° F. (660° C.), the valve assembly 45a separating the second treatment gas producing chamber 20 from the reactor chamber 15 is opened. This provides that the halide containing gas, e.g., boron trifluoride (BF$_3$), that is formed in the second treatment gas producing chamber 20, e.g., via thermal decomposition of potassium fluoroborate (KBF$_4$), can be moved from the second treatment gas producing chamber 20 to the reactor chamber 15. Still referring to step 147 of the process flow depicted in FIG. 9, while the second treatment gas producing chamber 20 is heated to decompose the halide containing solid material, e.g., potassium fluoroborate (KBF$_4$), the reactor chamber 15 is heated towards a temperature that is suitable for boriding. More specifically, in some embodiments, the temperature of the reactor chamber 15 during step 147 is increased so that when the valve assembly 45a between the reactor chamber 15 and the second treatment gas producing chamber 20 is opened, the temperature of the boron containing solid form 50 is suitable for reaction with the halide containing gas. The reaction of the halide containing gas, e.g., boron trifluoride gas (BF$_3$), and the boron containing solid form 50, e.g., boron containing solid form 50 composed of boron carbide (B$_4$C), produces the gas, e.g., boron difluoride (BF$_2$), for boriding the apex region 200 of the knife structure 100. Further, the temperature of the reactor chamber 15 is heated to increase the temperature of the knife structure 100 to promote diffusion of the boron (B) into the apex region 200 of the knife structure 100 from the boriding gas, e.g., boron difluoride (BF$_2$).

During step 147 of the process flow depicted in FIG. 9, the temperature of the reactor chamber 15 is increased to about 1250° F. (660° C.) before the valve assembly 45a that is separating the reactor chamber 15 from the second treatment gas producing chamber 20 is opened. In one embodiment, the rate at which the temperature is increased in the reactor chamber 15 and the second treatment gas producing chamber 20 may range from 200° F. (93° C.) per hour to 300° F. (150° C.) per hour. In another embodiment, the rate at which the temperature is increased in the reactor chamber 15 and second first treatment gas producing chamber 20 may range from 225° F. (107° C.) per hour to 275° F. (135° C.) per hour.

In some embodiments, after the valve assembly 45a that is separating the second treatment gas producing chamber 20 from the reactor chamber 15 is opened, the temperature of the second treatment gas producing chamber 20 and the temperature of reactor chamber 15 are increased to move the halide containing gas, e.g., boron trifluoride (BF$_3$), from the second treatment gas producing chamber 20 to the reactor chamber 15 at step 148 of the process flow depicted in FIG. 9. More specifically, in some embodiments, to move the halide containing gas, e.g., boron trifluoride (BF$_3$), from the second treatment gas producing chamber 20 to the reactor chamber 15, the temperature of the second treatment gas producing chamber 20 is increased to be greater than the temperature of the reactor chamber 15. By introducing a temperature gradient between the second reaction gas producing chamber 20 and the reactor chamber 15 the halide containing gas, e.g., boron trifluoride (BF$_3$), is moved to the reactor chamber 15 by a heat flow mechanism. The term "heat flow" denotes the transfer of thermal energy from a region having a higher temperature to a region having a lower temperature.

In one embodiment, to move the halide containing gas, e.g., boron trifluoride (BF$_3$), from the second treatment gas producing chamber 20 to the reactor chamber 15, the temperature of the second treatment gas producing chamber 20 is increased to be greater than 50° F. higher than the reactor chamber 15. In one embodiment, to move the halide containing gas, e.g., boron trifluoride (BF$_3$), from the second treatment gas producing chamber 20 to the reactor chamber 15, the temperature of the second treatment gas producing chamber 20 is increased to be greater than 100° F. higher than the reactor chamber 15. In one example, to move the halide containing gas, e.g., boron trifluoride (BF$_3$), from the second treatment gas producing chamber 20 to the reactor chamber 15, the temperature of the second treatment gas producing chamber 20 is increased to be within the range of 50° F. to 300° F. greater than the reactor chamber 15. In another example, to move the halide containing gas, e.g., boron trifluoride (BF$_3$), from the second treatment gas producing chamber 20 to the reactor chamber 15, the temperature of the second treatment gas producing chamber 20 is increased to be within the range of 100° F. to 200° F. greater than the reactor chamber 15.

The temperature of the reactor chamber 15 is typically selected to promote that the halide containing gas, e.g., boron trifluoride (BF$_3$), reacts with the boron containing solid form 50 to produce the gas for boriding the apex region 200 of the knife structure 100, e.g., boron difluoride (BF$_2$). In one embodiment, the reaction between the boron containing solid form 50 of boron carbide (B$_4$C), and the halide containing gas of boron trifluoride (BF$_3$) is as follows:

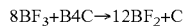

$$8BF_3 + B4C \rightarrow 12BF_2 + C$$

The temperature of the reactor chamber 15 is also selected to promote diffusion of boron from the boriding gas, e.g., boron difluoride (BF$_2$), into the apex region 200 when the exposed portion of the knife structure 100 is contacted by the boriding gas. For example, diffusion of the boron (B) into the knife structure 100, such as a knife composed of low carbon steel, produces boron containing compounds, i.e., borides, such as iron borides including FeB and/or Fe$_2$B. Typically, the boriding, e.g., diffusion of boron (B) into the apex region 200 of the knife structure 100 to form metal borides at a surface region of the knife structure 100, takes place at temperatures between approximately 850° C. and 950° C. (1560° F. and 1740° F.).

In some embodiments, at step 148 of the process flow depicted in FIG. 9, the temperature of the reactor chamber 15 and the second treatment gas producing chamber 20 is increased to a temperature within the range of 1750° F. (955° C.) to 1900° F. (1023° C.), wherein a difference between the temperature of the reactor chamber 15 and the second treatment gas producing chamber 20 moves the halide containing gas, e.g., boron trifluoride (BF$_3$), to the reactor chamber 15. In another embodiment, the temperature of the reactor chamber 15 and the second reaction gas producing chamber 20 is increased to a temperature within the range of 1800° F. (982° C.) to 1875° F. (1023° C.).

There may also be an increase in rate that the temperature is increased for the second treatment gas producing chamber 20 and the reactor chamber 15 during step 148 of the process flow depicted in FIG. 9. For example, during step 148 of the process flow depicted in FIG. 9, the rate at which the temperature is increased in the reactor chamber 15 and the second treatment gas producing chamber 20 may range from 100° F. (37° C.) per hour to 1000° F. (537° C.) per hour. In another embodiment, the rate at which the temperature is increased in the reactor chamber 15 and the second treatment gas producing chamber 20 may range from 200° F. (93° C.) per hour to 500° F. (260° C.) per hour.

In one embodiment, the different in temperature between the reactor chamber 15 and the second treatment gas producing chamber 20 during step 148 of the process flow depicted in FIG. 9 is maintained for a period of 5 minutes to 25 minutes. In another embodiment, the different in temperature between the reactor chamber 15 and the second treatment gas producing chamber 20 is maintained for a period of 10 minutes to 20 minutes. In one example, the different in temperature between the reactor chamber 15 and the second treatment gas producing chamber 20 is maintained for a period of 15 minutes.

At step 149 of the process flow depicted in FIG. 9, the temperature of the second treatment gas producing chamber 20 is reduced to be substantially equal to the temperature of the reactor chamber 15, and to provide equilibrium between the second treatment gas producing chamber 20 and the reactor chamber 15. By providing an equilibrium between the second treatment gas producing chamber 20 and the reactor chamber 15, uniformity of the boriding treatment to the apex region 200 of the knife structure 100 may be enhanced. In some embodiments, the temperature of the second reaction gas producing chamber 20 and the temperature of the reactor chamber 15 is selected to provide for optimum boronizing in the reactor chamber 15. For example, the temperature of the reactor chamber 15 and the second treatment gas producing chamber 20 at step 149 of the process flow depicted in FIG. 9 may range from 1562° F. (~850° C.) to 1900° F. (~1025° C.). In another example, the temperature of the reactor chamber 15 and the second reaction gas producing chamber 20 at step 149 of the process flow depicted in FIG. 9 may range from 1700° F. (~925° C.) to 1875° F. (~1020° C.). Once flow of the boriding chemicals from the second treatment gas producing chamber 20 has stopped, the flow of argon and hydrogen gas may again be introduced to the reactor chamber 15 to purge the vessel, e.g., at a flow rate of 10 standard cu ft/hr for about 5 minutes.

At step 150 of the process flow depicted in FIG. 5, a chrome and rare earth (RE) metal containing reactive gas is applied to the knife structure 100 that is present in the reaction chamber 15 from a third reactive gas producing chamber 30. More specifically, in one embodiment, while the reactor chamber 15 is heating to a temperature ranging from 1832° F. (1000° C.) to 1868° F. (1020° C.), e.g., 1850° F. (1010° C.), the third reaction gas producing chamber 30 containing a mixture of chemicals, such as chrome (Cr), nickel (Ni) and boron (B), as well as rare earth elements, such as cerium oxide ($CeO_2$) and/or neodymium oxide, may be heated to a temperature ranging from 1562° F. (850° C.) to 1700° F. (925° C.), e.g., about 1650° F. (898° C.). In another embodiment, while the reactor chamber 15 is heating to the desired temperature ranging from 1832° F. (1000° C.) to 1868° F. (1020° C.), e.g., 1850° F. (1010° C.), the third reaction gas producing chamber 30 containing a mixture of chemicals, such as chrome (Cr), nickel (Ni) and boron (B), may be heated to a temperature ranging from 830° C. to 900° C. In another embodiment, while the reactor chamber 15 is heating to the desired temperature ranging from 1832° F. (1000° C.) to 1868° F. (1020° C.), e.g., 1850° F. (1010° C.), the third treatment gas producing chamber 30 containing a mixture of chemicals, such as chrome (Cr), nickel (Ni) and boron (B), may be heated to a temperature ranging from 1598° F. (870° C.) to 1634° F. (890° C.).

To allow for reactant chemicals to flow from the third treatment gas producing chamber 30 to the reactor chamber 15, the valve assembly 45c between the third treatment gas producing chamber 30 and the manifold 65 to the reactor chamber 15 is opened. In one embodiment, the period of time that the reactant chemicals for the chrome and rare earth elements are present in the reactor chamber 15 may range from 30 minutes to 60 minutes. In another embodiment, the period of time that the reactant chemicals for the chrome and rare earth elements are present in the reactor chamber 15 for may range from 35 minutes to 55 minutes. In one example, the period of time that the reactant chemicals for the chrome and rare earth elements may be 45 minutes. Following treatment of the apex region 200 of the knife structure 100, the chrome and rare earth (RE) metal containing reactive gas may be purged from the reactor chamber. The aforementioned periods of time are provided for illustrative purposes only. For example, the above time periods can be suitable for knife applications employed in wood processing. In other examples, greater time periods may be employed to provide a greater diffusion depths. For example, the aforementioned time periods may be extended up to 24 hours.

At step 155 of the process flow depicted in FIG. 5, a vanadium boride producing reactive gas is applied to the knife structure 100 that is present in the reaction chamber 15 from the fourth reactive gas producing chamber 35. The fourth treatment gas producing chamber 35 may include ferrovanadium (FeV), aluminum oxide ($Al_2O_3$) and ammonia chloride ($NH_4Cl$) may be heated to a temperature ranging from about 1832° F. (1000° C.) to 1868° F. (1020° C.). In one example, the temperature of the fourth treatment gas producing chamber 35 is 1850° F. (1010° C.). Once the reactor chamber 15 has been purged and heated to the desired temperature ranging from 1832° F. (1000° C.) to 1868° F. (1020° C.), e.g., 1850° F. (1010° C.), the flow rate of the argon and hydrogen gas mixture may be reduced to 2 standard cu ft/hr, while a flow of reactant chemicals, e.g., ferrovanadium (FeV), aluminum oxide ($Al_2O_3$) and ammonia chloride ($NH_4Cl$), from the third treatment gas producing chamber 30 may flow into the reactor chamber 15 for a period of time to allow for the vanadizing reactions to occur. To allow for reactant chemicals to flow from the fourth treatment gas producing chamber 35 to the reactor chamber 15, the valve assembly 45d between the fourth treatment gas producing chamber 35 and the manifold 65 to the reactor chamber 15 is opened.

In one embodiment, the period of time that the reactant chemicals from the fourth treatment gas producing chamber 35 are present in the reactor chamber 15 for vanadizing may range from 30 minutes to 60 minutes. In another embodiment, the period of time that the reactant chemicals are present in the reactor chamber 15 for vanadizing the metal work piece 10 may range from 35 minutes to 55 minutes. In one example, the period of time that the reactant chemicals are present in the reactor chamber 15 for vanadizing the metal work piece 10 may be 45 minutes.

Upon completion of the vanadizing reactions, the flow of the vanadizing reactant gas from the fourth treatment gas producing chamber 35 is stopped and the reactor chamber 15 may be allowed to cool by the inflow of an inert gas, such as argon (Ar) or a blend of argon (Ar) and hydrogen (H). For example, the valve assembly 45d, between the fourth treatment gas producing chamber 35 and the manifold 65 to the reactor chamber 15 may be closed, and the temperature of the reactor chamber 15 may be cooled to about 1598° F. (870° C.). In one embodiment, once the reactor chamber 15 is cooled to about 1598° F. (870° C. ° C.), purge gas of argon and hydrogen may flow to the reactor chamber 15 for sufficient time to purge the reactor chamber 15 of the vanadizing reactant gas. In one embodiment, the time to purge the reactor chamber 15 of the vanadizing reactant gas may be on the order of 5 minutes.

The vanadium reactants diffuse through the knife body to provide the vanadium boride, and vanadium carbide elements that have been described above with reference to FIG. 3.

The reactor chamber 15 may be cooled room temperature to remove the knife structure 100 that has been thermochemically treated. Because the metal knife structure 100 has been borided without direct contact with a physical boriding agent, such as a boron containing powder or frit, the borided metal will not require cleaning to remove boriding agents from the surface of the knife structure 100, i.e., surface of the apex region 200 of the knife structure 100. In some embodiments, once the metal knife structure 100 reaches a temperature on the other of 100° F., a tempering process may be applied to stabilize the martensitic phase of the metal knife structure 100. In some embodiments, the tempering steps may be optional.

In some embodiments, after the knife structure 100 is removed from the multi-component boriding apparatus 500, a corrosion protection layer 205 is formed on the exterior surface of the apex region 200 of the knife structure 100 at step 160 of the process flow depicted in FIG. 5. The corrosion protection layer 205 may be composed of one of boron nitride, boron carbide, silicon carbide, $WS_2$, $MoS_2$ and a combination thereof. The corrosion layer 25 may be formed by chemical vapor deposition, physical vapor deposition, spray deposition, thermal spray and combinations thereof. In another example, the corrosion protection layer 205 may be formed using a combination of thermochemical diffusion and oxidation/nitridation process steps. For example, chromium (Cr) elements may be diffused to the surface of the knife structure from the metal composition of the knife body and then oxidized by an oxygen containing atmosphere to form a chromium oxide species, e.g., chromium oxide. In yet another example, boron elements may be diffused to the surface of the knife structure from the metal composition of the knife body and then nitrided to form boron nitride by a nitrogen containing atmosphere. The thickness of the corrosion protection layer may range from 5 microns to 30 microns. In another embodiment, the thickness of the corrosion protection layer 5 may range from 10 microns to 25 microns. In one example, the thickness of the corrosion protection layer 5 is on the order of 20 microns.

It is noted that the above process sequence is only one embodiment of the present disclosure. For example, the plating and thermochemical diffusion sequence that is described above may be inversed. More specifically, embodiments have been contemplated in which the apex region 200 of the knife structure 100 is first boronized, and then the entire knife structure 100 including the boronized apex region 200 is plated with the thermally conductive plating 104. With the exception of the change in sequence, the details of the following described process steps are provided by the above-described embodiments.

In one embodiment, the method of forming the knife structure 100 includes providing a knife body having a cutting surface 101, a relief surface 102 and a knife clamp surface 103, wherein the cutting surface 101 and the relief surface 102 intersect at an apex region 200. A description of the knife body has been provided above with reference to FIG. 1. The apex region 200 may then be borided. A further description of the boriding process and the layers of thermally diffused elements, e.g., borides and carbides, within the apex region 200 is provided above with reference to FIGS. 3 and 5-10. The boriding of the apex region 200 may include positioning the knife body within a fixture leaving the apex region 200 exposed, wherein a remaining portion of the knife body is masked by the fixture 52. The fixture 52 obstructs the thermochemically diffused elements from being introduced to any other region of the knife structure besides the apex region 200. Following boriding of the apex region 200, the thermally conductive plating 104 is applied to the knife structure 100. The thermally conductive plating 104 may be applied to the entire surface of the knife structure 100 including the apex region. Further details regarding the composition and methods for forming the thermally conductive plating 104 are found above with reference to FIGS. 1, 4A-4C and 5. In some embodiments, the thermally conductive plating 104 transmits heat that is produced at the apex region 200 of the knife body to a heat sink that is in contact with the knife clamp surface of the knife body 100. Further details regarding the functionality of the heat management component of the knife structure have been described above with reference to FIG. 2. In one embodiment, the thermally conductive plating 104 that is present on the apex region 200 is worn from the knife body during operation of the knife structure 100.

While the present disclosure has been particularly shown and described with respect to preferred embodiments thereof, it will be understood by those skilled in the art that the foregoing and other changes in forms and details may be made without departing from the scope and spirit of the present disclosure. It is therefore intended that the present disclosure not be limited to the exact forms and details described and illustrated, but fall within the scope of the appended claims.

What is claimed is:

1. A knife structure comprising:
a knife body comprising a cutting surface, a relief surface and a knife clamp surface, wherein the cutting surface and the relief surface intersect at an apex region of the knife body, the apex region being multilayered, wherein within the apex region comprises a core of a base material for the knife body, a first layer that is adjacent to the core of the base material, wherein a carbon content of the first layer is greater than the base material, a second layer of the alloy of the base material and a boron containing compound adjacent to the first layer, wherein the boron containing compound is selected from the group consisting of FeB, Fe$_2$B, CrB$_2$, NiB, B$_4$C, VB$_2$, SiB$_2$, ZrB$_2$, YB$_6$, NdB$_6$, CeB$_6$, TiB$_2$, MoB, WB, and combinations thereof, a third layer that is boronized with additions of chromium and rare earth metals, and a fourth layer of a corrosion protecting composition, wherein the fourth layer provides an exterior surface of the apex region.

2. The knife structure of claim 1 further comprising a thermally conductive plating on at least the knife clamp surface, the cutting surface and the relief surface, the thermally conductive plating not being present on the apex region, wherein the thermally conductive plating has a thermal conductivity that is greater than the base material, and the thermally conductive plating transmits heat produced in the apex region to a heat sink that is contact with the knife clamp surface.

3. The knife structure of claim 2, wherein the thermally conductive plating is a composition selected from the group consisting of copper (Cu), silver (Au), gold (Ag), chromium (Cr), molybdenum (Mo), tungsten (W), aluminum (Al), and combinations thereof or the thermally conductive plating is a ceramic composition that is selected from the group consisting of aluminum nitride, boron nitride, silicon carbide and combinations thereof.

4. The knife structure of claim 2, wherein a non-linear non-repeated diffused zone of alloying elements between the apex region and the thermally conductive layer provides for a gradient of mechanical properties within the knife body that obstructs crack propagation.

5. The knife structure of claim 1, wherein the second layer further comprises vanadium boride, yttria stabilized zirconia (YSZ) or a combination thereof.

6. The knife structure of claim 1, wherein the rare earth elements are selected from the group consisting of lanthanum, cerium, neodymium, samarium, europium, dysprosium, holmium, erbium, thulium, ytterbium, lutetium and a combination thereof, and the chromium in the second layer is selected from the group consisting of ferro chrome, chrome oxide, chromic acid, chrome carbide, chrome containing alloys and combinations thereof.

7. The knife structure of claim 1, wherein the corrosion protecting composition is a ceramic composition selected from the group consisting of boron nitride, boron carbide, silicon carbide, and combinations thereof, or the corrosion protecting composition is a non-ceramic inorganic selected from the group consisting of WS$_2$, MoS$_2$ and a combination thereof 8. A knife structure comprising:
a knife body having a cutting surface, a relief surface and a knife clamp surface, wherein the cutting surface and the relief surface intersect at an apex region of the knife body, wherein the apex region is multi-layered and comprises a core of a base material for the knife body, a first layer that is adjacent to the core of the base material having a carbon content that is greater than the base material, a second layer of an alloy of the base material and a boron containing compound adjacent to the first layer, a third layer that is boronized with additions of chromium and rare earth metals, and a fourth layer of a corrosion protecting composition, wherein the fourth layer provides an exterior surface of the apex region.

9. The knife structure of claim 8 further comprising a thermally conductive plating present on at least the knife clamp surface, the cutting surface and the release surface of the knife body, wherein the thermally conductive plating is present covering an entirety of the apex region of the knife structure or the thermally conductive plating is not present on the apex region.

10. The knife structure of claim 9, wherein the thermally conductive plating has a thermal conductivity that is greater than the base material, and the thermally conductive plating transmits heat produced in the apex region to a heat sink that is contact with the knife clamp surface.

11. The knife structure of claim 8, wherein the second layer further comprises vanadium boride, yttria stabilized zirconia (YSZ) or a combination thereof.

12. The knife structure of claim 8, wherein the rare earth elements are selected from the group consisting of lanthanum, cerium, neodymium, samarium, europium, dysprosium, holmium, erbium, thulium, ytterbium, lutetium and a combination thereof, and the chromium in the second layer is selected from the group consisting of ferro chrome, chrome oxide, chromic acid, chrome carbide, chrome containing alloys and combinations thereof.

13. The knife structure of claim 8, wherein the corrosion protecting composition is a ceramic composition selected from the group consisting of boron nitride, boron carbide, silicon carbide, and combinations thereof, or the corrosion protecting composition is a non-ceramic inorganic selected from the group consisting of $WS_2$, $MoS_2$ and a combination thereof.

14. The knife structure of claim 8, wherein a non-linear non-repeated diffused zone of alloying elements between the apex region and the thermally conductive layer provides for a gradient of mechanical properties within the knife body that obstructs crack propagation.

\* \* \* \* \*